(12) United States Patent
Campbell et al.

(10) Patent No.: US 7,657,347 B2
(45) Date of Patent: Feb. 2, 2010

(54) TEMPERATURE-BASED MONITORING METHOD AND SYSTEM FOR DETERMINING FIRST AND SECOND FLUID FLOW RATES THROUGH A HEAT EXCHANGER

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 12/031,997

(22) Filed: Feb. 15, 2008

(65) Prior Publication Data

US 2009/0207564 A1 Aug. 20, 2009

(51) Int. Cl.
G05D 23/00 (2006.01)
G01F 1/00 (2006.01)
G01K 1/08 (2006.01)
G06F 11/30 (2006.01)
F16K 49/00 (2006.01)

(52) U.S. Cl. .................. 700/300; 700/276; 702/45; 702/132; 702/182; 137/340; 165/288; 165/292; 165/293; 165/299; 165/300

(58) Field of Classification Search ............ 700/28–30, 700/46, 47–49, 275–278, 282, 299, 300; 165/200, 205, 208–210, 213, 287, 288, 292–294, 165/296, 299, 300; 236/18, 19; 361/688, 361/689, 701; 702/45, 132, 182; 137/3, 137/10, 340

See application file for complete search history.

(56) References Cited

U.S. PATENT DOCUMENTS

| | | | |
|---|---|---|---|
| 6,574,104 B2 | 6/2003 | Patel et al. | |
| 6,775,997 B2 | 8/2004 | Bash et al. | |
| 6,931,352 B2 * | 8/2005 | Cryer et al. | .......... 702/182 |
| 7,011,143 B2 | 3/2006 | Corrado et al. | |
| 2005/0023363 A1 | 2/2005 | Sharma et al. | |
| 2005/0235671 A1 | 10/2005 | Belady et al. | |
| 2006/0232945 A1 | 10/2006 | Chu et al. | |

* cited by examiner

*Primary Examiner*—Sean P Shechtman
(74) *Attorney, Agent, or Firm*—Geraldine Monteleone, Esq.; Kevin P. Radigan, Esq.; Heslin Rothenberg Farley & Mesiti, P.C.

(57) ABSTRACT

Monitoring method and system are provided for dynamically determining flow rate of a first fluid and a second fluid through a heat exchanger. The method includes: pre-characterizing the heat exchanger to generate pre-characterized correlation data correlating effectiveness of the heat exchanger to various flow rates of the first and second fluids through the heat exchanger; sensing inlet and outlet temperatures of the first and second fluids through the heat exchanger, when operational; automatically determining flow rates of the first and second fluids through the heat exchanger using the sensed inlet and outlet temperatures of the first and second fluids and the pre-characterized correlation data; and outputting the determined flow rates of the first and second fluids. The automatically determining employs the determined effectiveness of the heat exchanger in interpolating from the pre-characterized correlation data the flow rates of the first and second fluids.

20 Claims, 15 Drawing Sheets

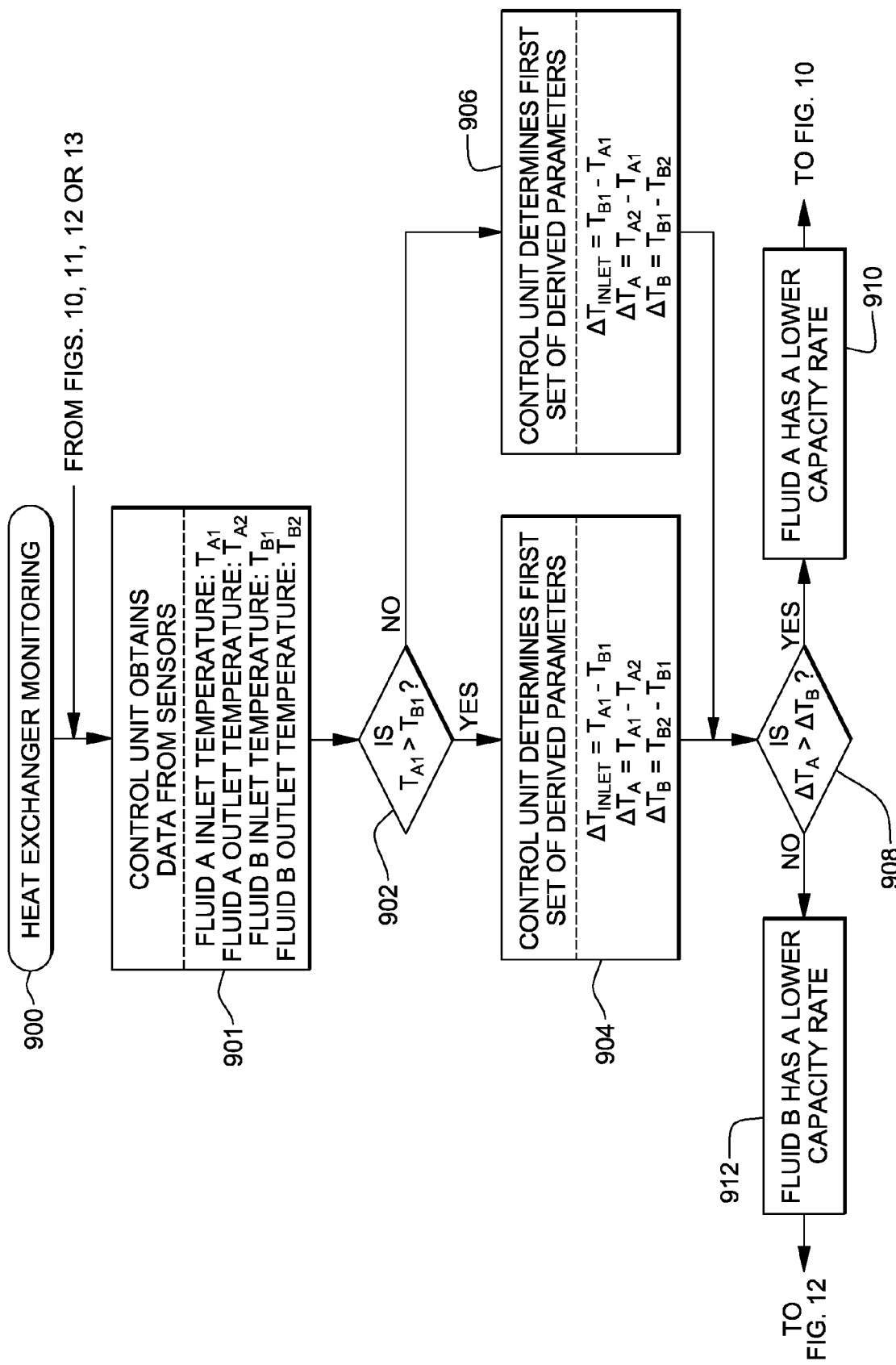

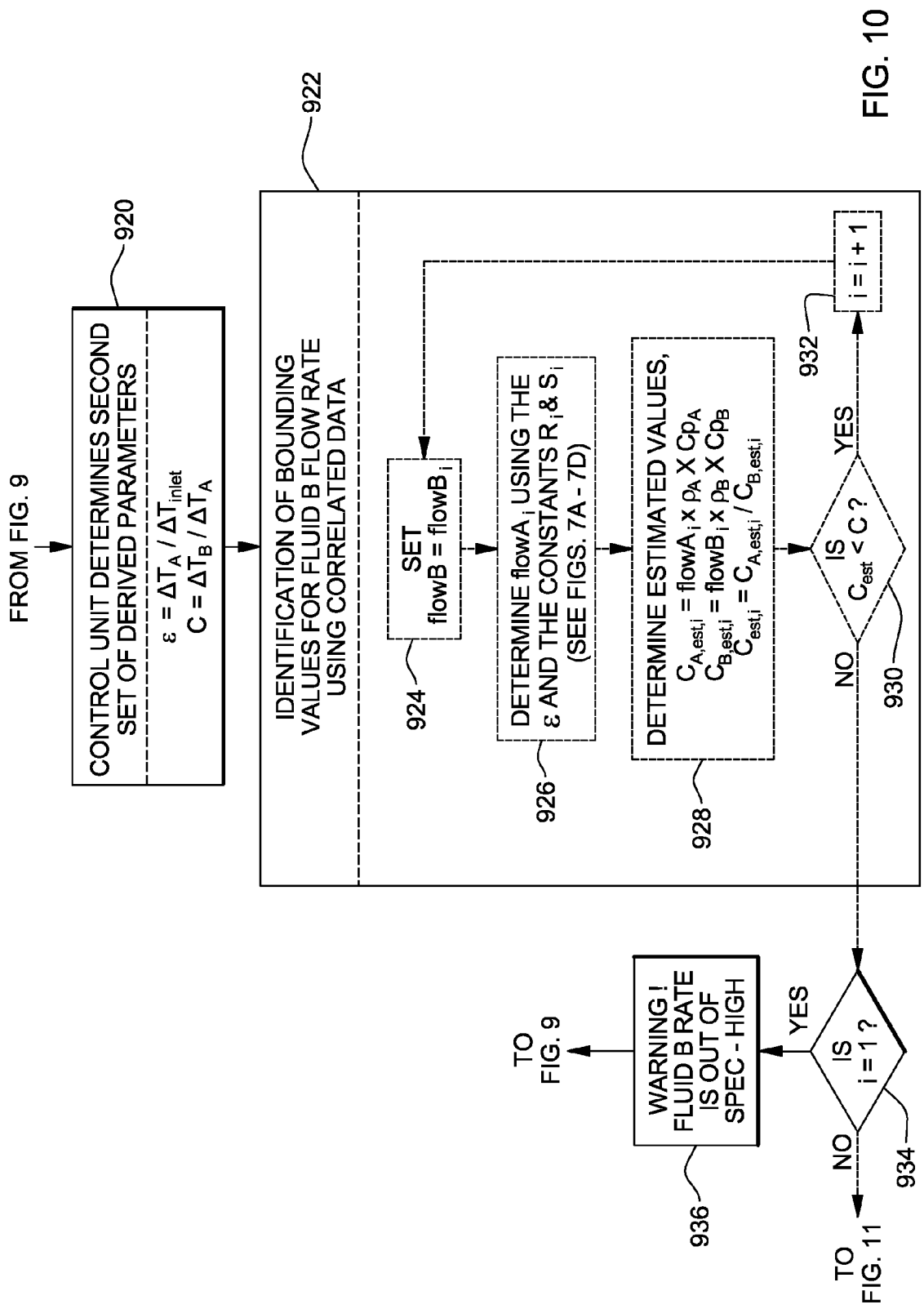

TEMPERATURE-BASED MONITORING METHOD AND SYSTEM FOR DETERMINING FIRST AND SECOND FLUID FLOW RATES THROUGH A HEAT EXCHANGER

TECHNICAL FIELD

The present invention relates in general to heat exchanger monitoring and management, and more particularly, to monitoring methods and systems for ascertaining fluid flow rates through a heat exchanger to facilitate, for example, management of cooling within a facility containing the heat exchanger, such as a data center containing one or more heat exchangers facilitating cooling of electronic components with the data center.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., a data center).

The sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

SUMMARY OF THE INVENTION

The shortcomings of the prior art are overcome and additional advantages are provided in one aspect through the provision of a method of monitoring a heat exchanger. The method includes: pre-characterizing a heat exchanger to generate pre-characterized correlation data for the heat exchanger, the pre-characterized correlation data comprising data correlating effectiveness of the heat exchanger to flow rates of a first fluid through the heat exchanger and flow rates of a second fluid through the heat exchanger, wherein when operational, heat is transferred across the heat exchanger between the first fluid and the second fluid; sensing inlet and outlet temperatures of the first fluid passing through the heat exchanger when operational; sensing inlet and outlet temperatures of the second fluid passing through the heat exchanger when operational; automatically determining at least one of a flow rate of the first fluid through the heat exchanger or a flow rate of the second fluid through the heat exchanger, the automatically determining employing the pre-characterized correlation data and the sensed inlet and outlet temperatures of the first fluid and the sensed inlet and outlet temperatures of the second fluid; and outputting the determined flow rate of the first fluid or flow rate of the second fluid through the heat exchanger.

In another aspect, a monitoring system for a heat exchanger is provided. The monitoring system includes a database holding pre-characterized correlation data for the heat exchanger. The pre-characterized correlation data includes data correlating effectiveness of the heat exchanger to flow rates of a first fluid through the heat exchanger and flow rates of a second fluid through the heat exchanger, wherein when operational, heat is transferred across the heat exchanger between the first fluid and the second fluid. The monitoring system further includes: a first inlet temperature sensor for sensing inlet temperature of the first fluid passing through the heat exchanger when operational; a first outlet temperature sensor for sensing outlet temperature of the first fluid passing through the heat exchanger when operational; a second inlet temperature sensor for sensing inlet temperature of the second fluid passing through the heat exchanger when operational; a second outlet temperature sensor for sensing outlet temperature of the second fluid passing through the heat exchanger; and a monitor unit coupled to the first and second inlet temperature sensors and the first and second outlet temperature sensors for obtaining the sensed inlet and outlet temperatures of the first and second fluids. The monitor unit employs the sensed inlet and outlet temperatures of the first and second fluids and the pre-characterized correlation data in automatically determining at least one of flow rate of the first fluid through the heat exchanger or flow rate of the second fluid through the heat exchanger, and outputs the determined flow rate of the first fluid or the flow rate of the second fluid through the heat exchanger.

In a further aspect, a data center is provided which includes a heat exchanger for facilitating cooling of at least one electronics rack within the data center; and a monitoring system for monitoring the heat exchanger. The monitoring system includes a database holding pre-characterized correlation data for the heat exchanger. The pre-characterized correlation data includes data correlating effectiveness of the heat exchanger to flow rates of a first fluid through the heat exchanger and flow rates of a second fluid through the heat exchanger, wherein when operational, heat is transferred across the heat exchanger between the first fluid and the second fluid. The monitoring system further includes: a first inlet temperature sensor for sensing inlet temperature of the first fluid passing through the heat exchanger when operational; a first outlet temperature sensor for sensing outlet temperature of the first fluid passing through the heat exchanger when operational; a second inlet temperature sensor for sensing inlet temperature of the second fluid passing through the heat exchanger when operational; a second outlet temperature sensor for sensing outlet temperature of the second fluid passing through the heat exchanger when operational; and a monitor unit coupled to the first and second inlet temperature sensors and the first and second outlet temperature sensors for obtaining the sensed inlet and outlet temperatures of the first and second fluids. The monitor unit employs the sensed inlet and outlet temperatures of the first and second fluid and the pre-characterized correlation data in automatically determining at least one of flow rate of the first fluid through the heat exchanger or flow rate of the second fluid through the heat exchanger, and outputs the determined flow rate of the first fluid or the flow of the second fluid through the heat exchanger.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 9-13 are a flowchart of one embodiment of processing implemented by a monitoring unit to ascertain fluid A and fluid B flow rates from only pre-characterized correlation data (e.g., the data represented by FIGS. 6A & 6B) and sensed fluid A inlet and outlet temperatures and fluid B inlet and outlet temperatures, in accordance with an aspect of the present invention.

DETAILED DESCRIPTION OF THE INVENTION

Figure 1:
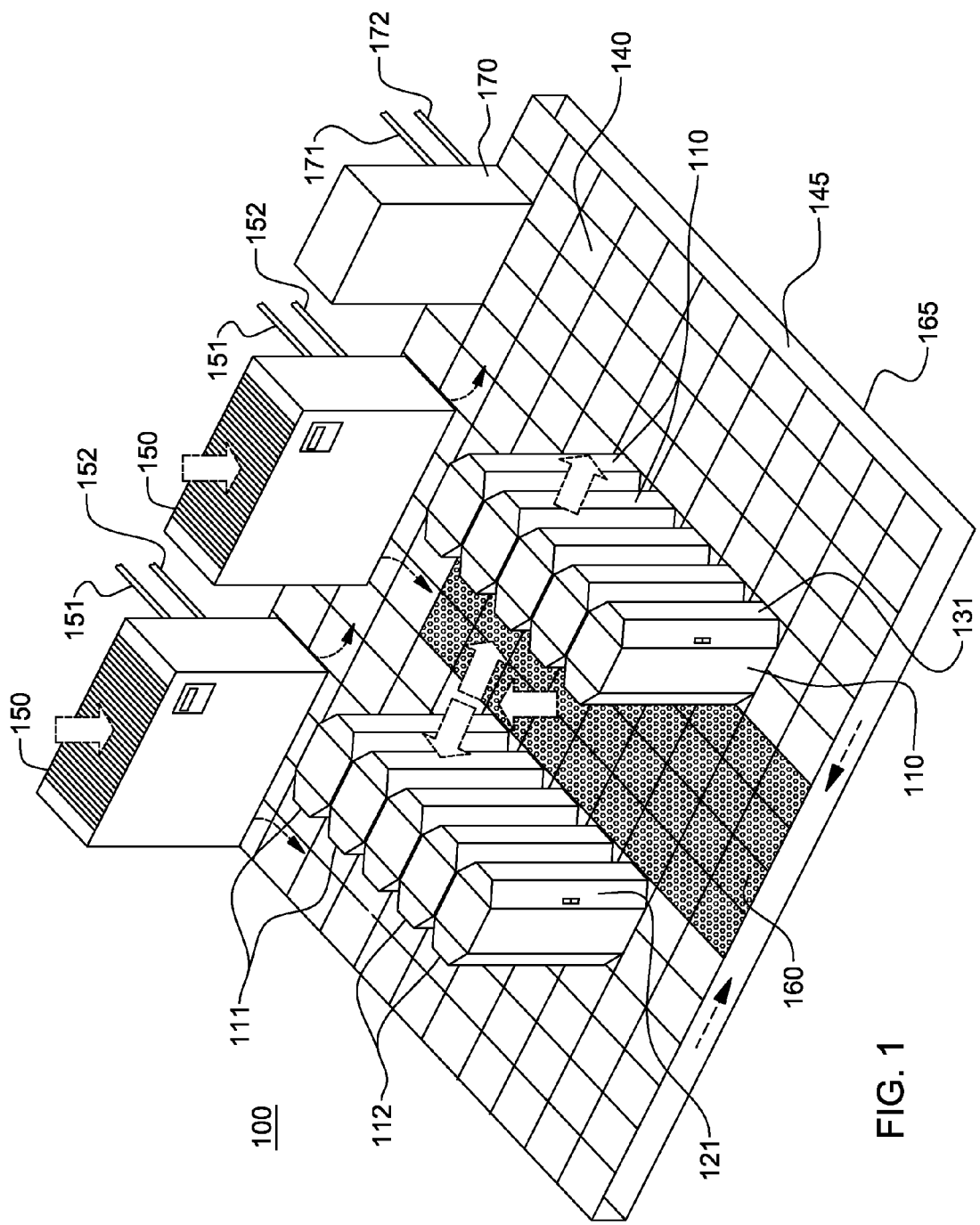
FIG. 1. depicts one embodiment of a data center room layout including a plurality of electronics racks, a plurality of computer room air-conditioning units, and a coolant distribution unit, and containing multiple heat exchangers to be monitored, in accordance with an aspect of the present invention.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of subsystems of an electronics rack to be cooled.

As used herein, "heat exchanger" means any heat exchange mechanism characterized as described herein through which a first fluid and a second fluid pass, and wherein heat transfer occurs between the first fluid and the second fluid across the heat exchanger. An air-to-air heat exchanger, an air-to-liquid heat exchanger, and a liquid-to-liquid heat exchanger are examples of a heat exchanger, as employed herein. Further, the concepts described below are applicable to any first and second fluid, referred to herein as fluid A and fluid B, which flow in parallel, or counter or across each other within the heat exchanger. Further, a heat exchanger may comprise one or more discrete heat exchange devices coupled in-series or in parallel, and may include one or more fluid flow paths, formed of thermally conductive tubing (such as copper or other tubing). Size, configuration and construction of the heat exchanger can vary without departing from the scope of the invention disclosed below. In addition, "data center" refers to a computer installation containing one or more electronics racks to be cooled. As a specific example, a data center may include one or more rows of rack-mounted computing units, such as server units.

One example of fluid A is air and fluid B is a coolant, such as water. In another example, fluid A is a facility coolant and fluid B a system coolant, with water being one example of the facility coolant and the system coolant. However, the concepts disclosed herein are readily adapted to use with other types of coolant. For example, one or more of the liquid coolants may comprise a brine, a fluorocarbon liquid, a liquid metal, or other similar coolant, or refrigerant, while still maintaining the advantages and unique features of the present invention. Unless otherwise specified, "fluid" refers to either a gas or a liquid, such as air or a gaseous coolant, or a liquid coolant.

Reference is made below to the drawings, which are not drawn to scale to facilitate conceptual understanding, and wherein the same reference numbers are used throughout different figures to designate the same or similar components.

FIG. 1 depicts one embodiment of a raised floor, data center room layout 100 comprising a plurality of heat exchangers to be monitored, in accordance with an aspect of the present invention. In this layout, multiple types of electronics racks, 110, 111 & 112 are disposed in two rows. A computer installation such as depicted in FIG. 1 may house several hundred, or even several thousand, microprocessors. In the arrangement of FIG. 1, chilled air enters the computer room floor via perforated tiles 160 from a supply air plenum 145 defined between the raised floor 140 and a base or subfloor 165 of the room. Cooled air is taken in through louvered front covers 121 at air inlet sides of the electronics racks 110, 111 & 112 and expelled through louvered back covers 131 (at the air outlet sides) of the electronics racks. Each electronics rack 110, 111 & 112 may have one or more air-moving devices (e.g., fans or blowers) to provide forced inlet-to-outlet airflow to cool the electronics within the subsystem(s) of the rack. The supply air plenum 145 provides conditioned and cooled air to the cold air inlet sides of the electronics racks via the perforated floor tiles 160 disposed in one or more "cold" air aisles of the computer installation. The conditioned and cooled air is supplied to plenum 145 via multiple computer room air-conditioning units (CRAC units) 150, also disposed within the computer installation 100, which reject heat from the room air to facility coolant flowing through air-to-liquid heat exchangers therein via facility coolant supply lines 151 and facility coolant return lines 152. Room air is taken into each computer room air-conditioning unit 150 near an upper portion thereof. This room air comprises in part exhausted air from the "hot" air aisles of the computer installation, with at least one side defined, for example, by the air outlet sides of an adjacent row of electronics racks 110, 111 or 112.

In this example, electronics racks 110 are air-cooled only, electronics racks 111 are air-cooled and include, for example, a rear door air-to-liquid heat exchanger (RDHx) for cooling air egressing from the electronics rack, and electronics racks 112 are air-cooled electronics racks employing liquid cooling of selected electronics components. The liquid cooling is provided by, for example, one or more modular cooling units (MCUs) disposed in the bottom of the rack. Coolant distribution unit 170 provides conditioned system coolant to electronics racks 111 and includes, in one example, a liquid-to-liquid heat exchanger across which heat is rejected from the system coolant to facility coolant flowing through coolant distribution unit 170 via facility coolant supply line 171 and facility coolant return line 172.

Air-cooled electronics racks 110 require proper functioning of computer room air-conditioning units 150 to sustain reliable operation. If the CRAC units fail to supply sufficient quantities of cool air into the pressurized under-floor plenum, then the air-cooled components of these electronics racks may experience higher than specified device temperatures, thus leading to reduced reliability and possible failure.

The air and liquid-cooled electronics racks 111, with the rear door heat exchangers mounted to the rack require chilled and conditioned coolant from the coolant distribution unit to be able to remove a significant fraction of the heat load. One rear door heat exchanger (RDHx) embodiment for electronics rack 111 is described in co-pending, commonly assigned U.S. patent application Ser. No. 11/108,306, entitled "Method and Apparatus for Facilitating Cooling of an Electronics Rack Employing a Heat Exchange Assembly Mounted to an Outlet Door Cover of the Electronics Rack", published Oct. 19, 2006 as U.S. Patent Publication No. 2006/0232945 A1.

Employing the rear door heat exchanger, a portion of the heat load exhausting from electronics rack 111 is rejected to the coolant passing through the heat exchanger. This process reduces the cooling burden on the room air-conditioning units when operational. If a problem arises, too much of the electronics rack heat load may be rejected into the room ambient air, resulting in a higher than anticipated burden on the CRAC units. This scenario may result in the room air temperature at the inlets to the nearby electronics racks rising as a result, which may lead to higher than anticipated device temperatures, thus compromising system reliability.

Modular cooling units (MCUs) are located at the bottom of a hybrid electronics rack 112. These racks contain both air and liquid-cooled components. The MCU(s) provides conditioned and cooled coolant to various liquid-cooled, high performance components located within electronics rack 112. One example of an electronics rack employing a MCU(s) is described in commonly assigned U.S. Pat. No. 7,011,143. If the MCU fails to function properly, and supplies warmer coolant or coolant at a lower flow rate than specified, then the high performance liquid-cooled components within the electronics rack may quickly become overheated and fail.

Thus, a common thermal element in the electronics racks depicted in FIG. 1 is the need for proper functioning of the various heat exchangers located within the data center. Specifically, the heat exchangers within the CRAC units 150, the heat exchanger within the coolant distribution unit 170, the rear door heat exchangers of electronics racks 111, and the heat exchangers of the MCUs of electronics racks 112 need to function properly. Three out of four of these heat exchange devices (i.e., the heat exchangers within the CRAC, CDU and MCU) are cooled at their heat rejection side by chilled coolant, such as water, from a facility chiller refrigeration plant. To function properly within design mode, each of these heat exchangers requires the correct temperature of chilled coolant and correct chilled coolant flow rate from the chiller plant. Each of the three device types (i.e., CRAC, CDU & MCU) has a fluid-moving subassembly (for example, fan, blower or pump) that needs to supply the coolant at the correct volumetric flow rate. Thus, two critical operating parameters common to three of the four heat exchange based devices (CRAC, CDU & MCU) are the coolant flow rates on the system side and the facility side, respectively. Depending on the device, the system side is the coolant loop (air or liquid) that directly cools the electronic components, or the rear door heat exchanger. The facility side is the chilled coolant loop from and returning to the chiller plant.

Described hereinbelow are a method and system for enabling the determination of fluid flow rates on each side of a fluid-to-fluid heat exchanger, such as the heat exchangers employed in the CRAC units, CDU unit, MCU units and RDHxs of FIG. 1, using only a pre-characterization of the heat exchanger and dynamic fluid temperature measurements.

Figure 2:
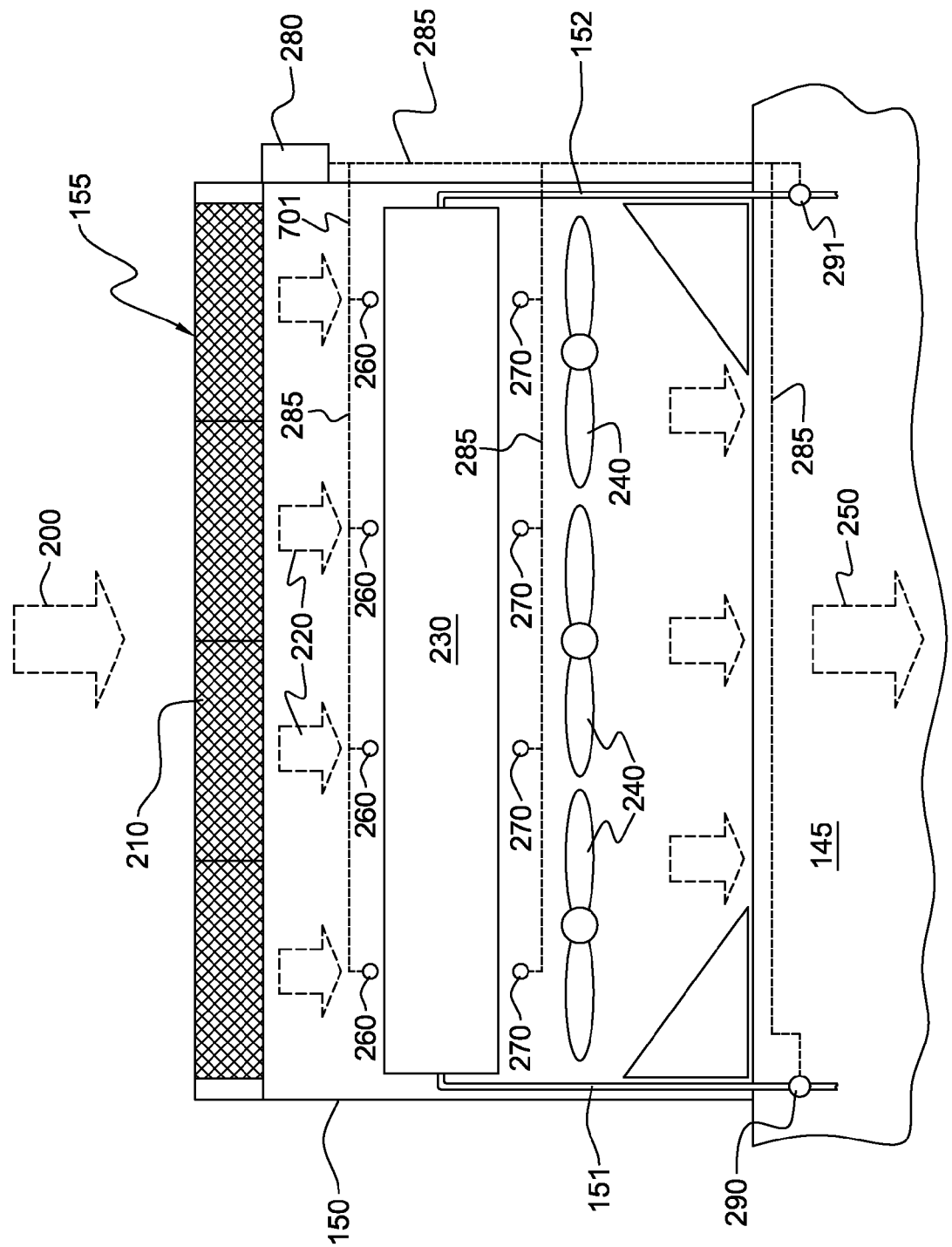
FIG. 2 is a cross-sectional elevational view of one embodiment of a computer room air-conditioning unit of the plurality of computer room air-conditioning units depicted in FIG. 1, and illustrating one embodiment of a monitoring system for the heat exchanger thereof, in accordance with an aspect of the present invention.

FIG. 2 illustrates one embodiment of a computer room air-conditioning unit 150 with a top to bottom airflow design, and which is used to provide temperature-conditioned air for electronics rack cooling in a raised floor data center configuration. As illustrated, warm computer room air 200 enters CRAC unit 150 via an open vent 155 at an air inlet of the CRAC unit, and flows through a set of air filters 210. After passing through air filters 210, the filtered, warm air 220 is cooled as it passes across an air-to-liquid heat exchanger 230. Coolant is provided via facility coolant supply line 151 and facility coolant return line 152. The filtered, warm air 220 is drawn across air-to-liquid heat exchanger 230 via one or more air-moving devices 240 (e.g., fans or blowers) disposed in the lower portion of CRAC unit 150. Cooled air 250 is pushed by air-moving devices 240 into space 145 under the raised floor to create the pressurized plenum needed to facilitate raised floor data center cooling via the perforated tiles discussed above with reference to FIG. 1. The air-to-liquid heat exchanger is typically supplied with sub-ambient chilled coolant from a refrigeration chiller plant. This chilled coolant absorbs heat from the warm air passing across the air-to-liquid heat exchanger, and rejects the heat to the refrigeration chiller plant (not shown).

In the illustrated embodiment, a monitoring system is provided for monitoring fluid flow rates on each side of the air-to-liquid heat exchanger 230. This system includes one or more temperature sensors 260 disposed at the air inlet side of air-to-liquid heat exchanger 230, and one or more temperature sensors 270 disposed at the air outlet side of air-to-liquid heat exchanger 230. Data lines 285 couple these temperature sensors to a monitor unit 280, which in the embodiment illustrated, is attached to CRAC unit 150. Temperature sensors 260, 270 are provided for monitoring (and allowing for respective averaging of, if desired) the air inlet temperature and air outlet temperature across air-to-liquid heat exchanger 230. Additionally, temperature sensors 290, 291 are provided in fluid communication with facility coolant inlet line 151 and facility coolant return line 152, respectively. These temperature sensors 290, 291 monitor the inlet and outlet temperatures, respectively, of the liquid coolant flowing through air-to-liquid heat exchanger 230. Temperature sensors 290, 291 also provide temperature data via respective data lines 285 to monitor unit 280.

Figure 3:
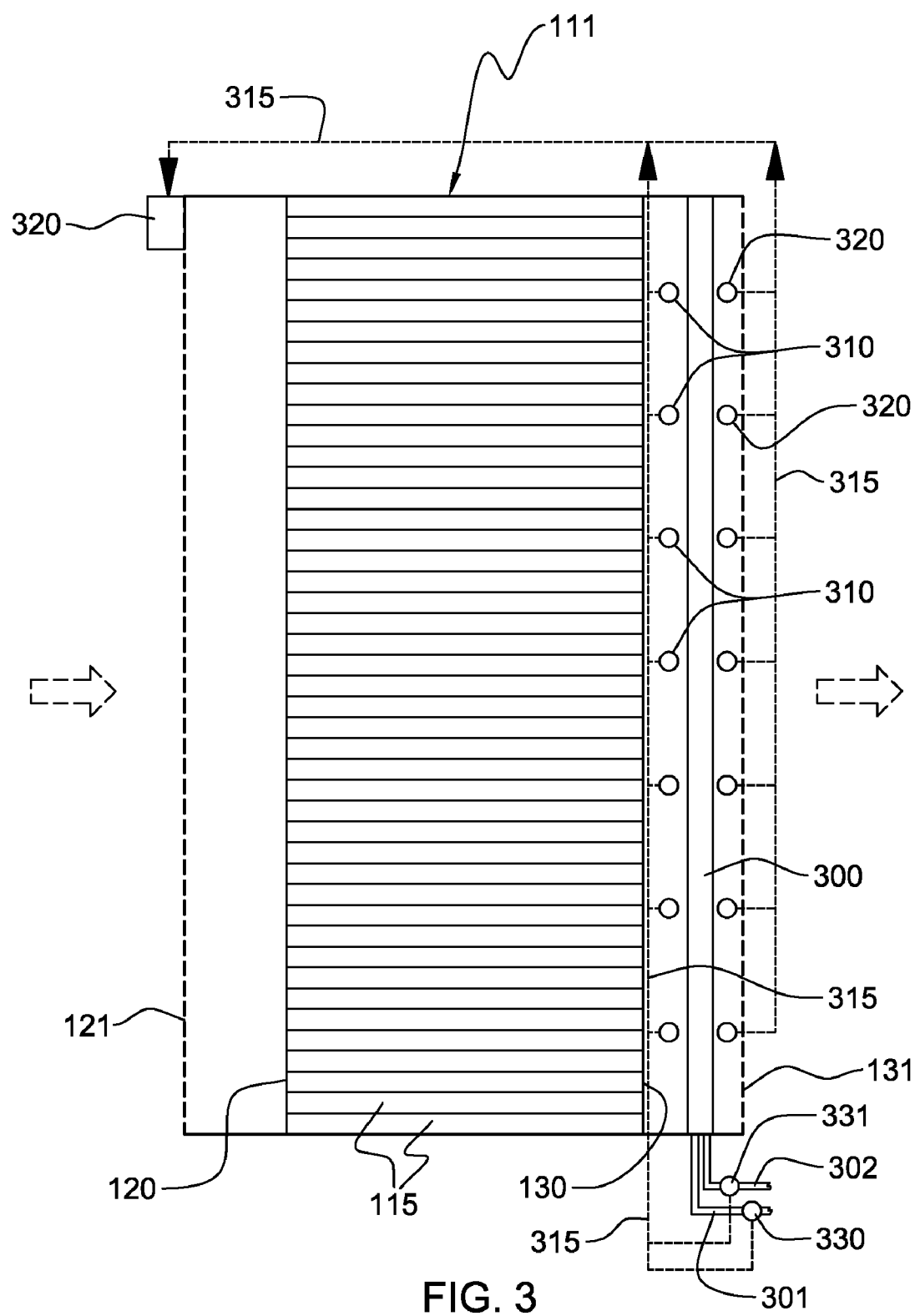
FIG. 3 is a cross-sectional elevational view of one embodiment of an electronics rack with a rear door heat exchanger and a monitoring system for the heat exchanger, in accordance with an aspect of the present invention.

FIG. 3 is a side elevational view of one embodiment of an electronics rack 111 employing a rear door heat exchanger (RDHx) 300. Electronics rack 111 includes an air inlet side 120 and an air outlet side 130, with respective louvered covers 121, 131 to facilitate airflow from the air inlet side to the air outlet side of the electronics rack. Electronics rack 111 also includes a plurality of horizontally-disposed electronics subsystems 115, such as a plurality of server nodes. As air flows through the electronics rack, it passes over electronics subsystems 115, removing heat from the nodes and expelling the heat out air outlet side 130 of the electronics rack.

Disposed in outlet door 131 is RDHx 300, which is an air-to-liquid heat exchanger, across which the inlet-to-outlet airflow through the electronics rack passes. Coolant distribution unit 170 (FIG. 1) provides conditioned and cooled system coolant to rear door heat exchanger 300 via system coolant supply line 301 and system coolant return line 302. Heat exchanger 300 removes heat from the exhausted inlet-to-outlet airflow through the electronics rack via the system coolant, for ultimate transfer in coolant distribution unit 170 (FIG. 1) to facility coolant passing therethrough via a liquid-to-liquid heat exchanger disposed therein (described below). The RDHx cooling apparatus advantageously reduces heat load on existing air-conditioning units within the data center, and facilitates cooling of the electronics rack by cooling the air egressing from the electronics rack, thus cooling any air recirculating to the air inlet side thereof.

In accordance with an aspect of the present invention, a monitoring system is provided which includes, in this embodiment, a plurality of temperature sensors 310 disposed on the air inlet side of rear door heat exchanger 300 and a plurality of temperature sensors 320 disposed on the air outlet side of rear door heat exchanger 300, which are respectively coupled via data cables 315 to a monitor unit 320. Additionally, a temperature sensor 330 is disposed in fluid communication with system coolant supply line 301 to sense system coolant inlet temperature to the heat exchanger and a temperature sensor 331 is disposed in fluid communication with system coolant return line 302 to sense system coolant outlet temperature from the heat exchanger. These temperature sensors 330, 331 are also coupled to monitor unit 320 via data cables 315 for forwarding sensed temperature values to the monitor unit. In one embodiment, monitor unit 320 is attached to electronics rack 111 in a location which can be readily viewed by a site engineer in order to obtain flow rate results, as described further below.

Figure 4:
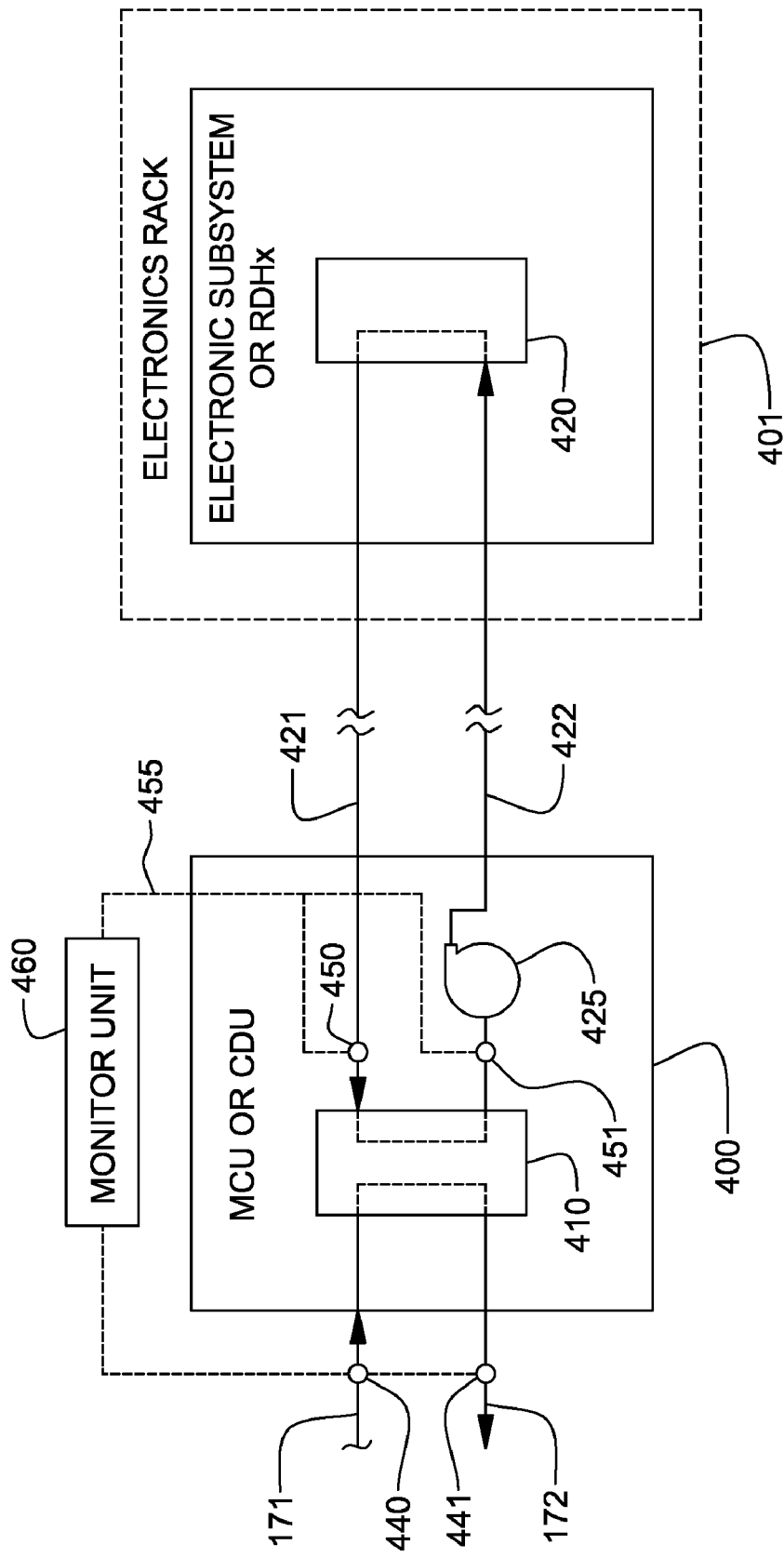
FIG. 4 is a schematic of one embodiment of fluid flows through a heat exchanger within a modular cooling unit or within a coolant distribution unit to be monitored, in accordance with an aspect of the present invention.

FIG. 4 is a schematic of another embodiment of a monitoring system, in accordance with an aspect of the present invention, applied to a liquid-to-liquid heat exchanger 410, which may be part of a modular cooling unit (MCU) or a coolant distribution unit 400. By way of example, the modular cooling unit may be disposed in a lower portion of an electronics rack 112 (see FIG. 1), while the coolant distribution unit may be a freestanding unit within the data center, such as coolant distribution unit 170 in data center 100 of FIG. 1. The modular cooling unit or coolant distribution unit 400 is associated with an electronics rack 401, such as electronics rack 111 or electronics rack 112 in FIG. 1. Electronics rack 401 includes a heat transfer device 420, for example, for extracting heat from air egressing from the air outlet side of the heat exchanger in the electronics rack 111 embodiment discussed above, or for extracting heat via conductive transfer from an electronics module (not shown).

The heat extracted via heat transfer device 420 is transferred via system coolant (circulated via pump 425 through system coolant return line 421 and system coolant supply line 422) to liquid-to-liquid heat exchanger 410 of the MCU or CDU 400. The system coolant loop and modular cooling unit (or coolant distribution unit) are designed to provide coolant of a controlled temperature and pressure, as well as a controlled chemistry and cleanliness to the heat transfer device 420. The system coolant is physically separate from the less controlled facility coolant in the facility coolant supply and return lines 171, 172, respectively, to which heat is ultimately transferred.

In this embodiment, the monitoring system includes an inlet temperature sensor 440 in fluid communication with the facility coolant supply line 171 and an outlet temperature sensor 441 in fluid communication with the facility coolant return line 172. Additionally, an inlet temperature sensor 450 is in fluid communication with the system coolant return line 421 and an outlet temperature sensor 451 is in fluid communication with the system coolant supply line 422. Temperature sensors 440, 441, 450 & 451 provide sensed temperature values to a monitor unit 460 via appropriate data lines 455. Monitor unit 460 may be coupled to the coolant distribution unit, or coupled to the electronics rack (depending on the implementation) for ready access by a data center administrator or site engineer.

Figure 5:
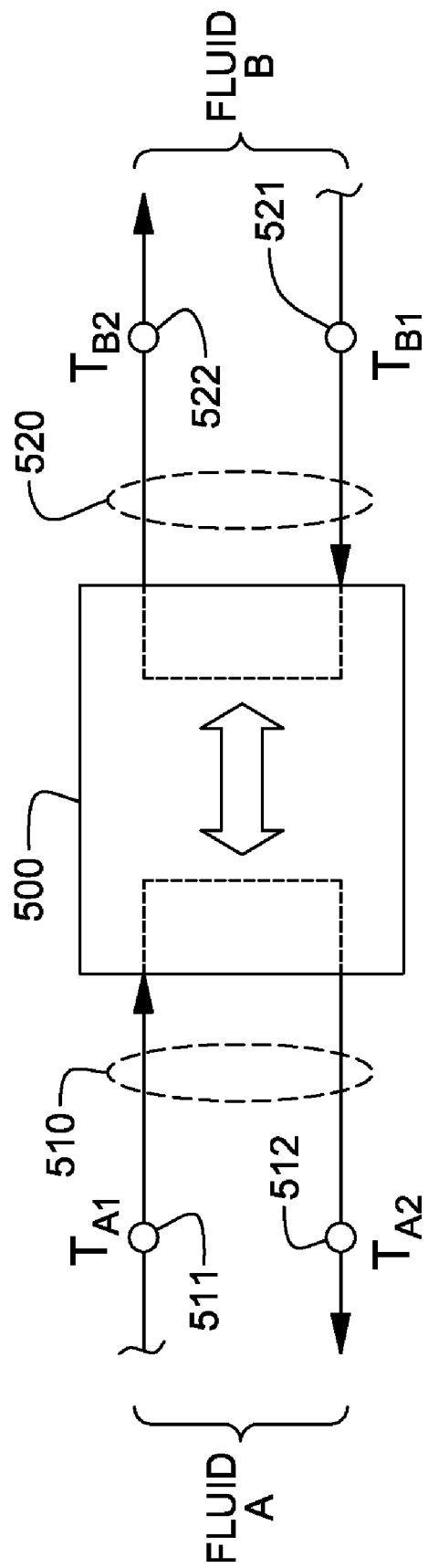
FIG. 5 is a schematic of a generalized heat exchanger with fluid A and fluid B to be monitored, in accordance with an aspect of the present invention.

FIG. 5 is a schematic of a generic fluid A to fluid B heat exchanger 500, wherein either fluid A or fluid B (or both fluid A and fluid B) may be a gas or liquid. Heat exchanger 500 facilitates the exchange of heat between fluid A in fluid A loop 510 and fluid B in fluid B loop 520. As shown, in accordance with an aspect of the present invention, an inlet temperature sensor 511 and outlet temperature sensor 512 are disposed in fluid A loop 510 for sensing inlet temperature $T_{A1}$ and outlet temperature $T_{A2}$, respectively, of fluid A. Similarly, an inlet temperature sensor 521 and outlet temperature sensor 522 are disposed in fluid communication with fluid B flowing through fluid B loop 520 to sense inlet temperature $T_{B1}$ and outlet temperature $T_{B2}$ of fluid B, respectively.

The monitoring method of the present invention is described below with reference to the generalized heat exchanger schematic of FIG. 5. This generic heat exchanger represents operation of the monitoring method and system disclosed herein for all of the various heat exchanger embodiments noted above in connection with FIGS. 1-4, i.e., the heat exchanger of a CRAC unit, the rear door heat exchanger, the heat exchanger of the coolant distribution unit, and the heat exchanger of the modular cooling unit.

Figure 6A:
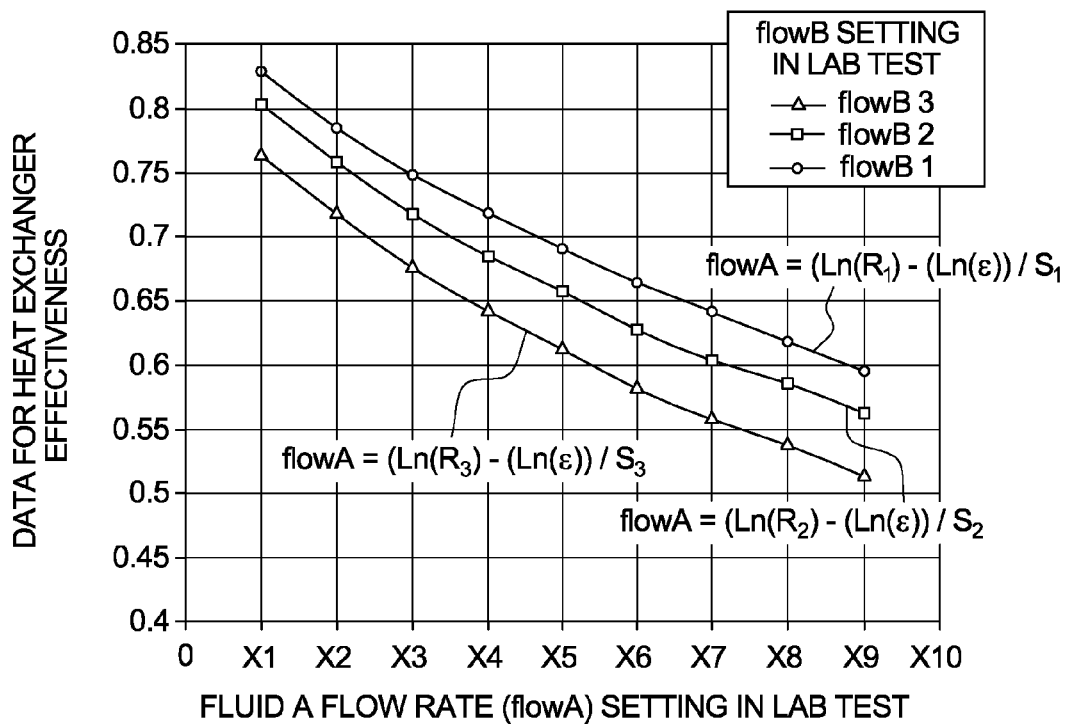
FIG. 6A is a graph of pre-characterized correlation data for a heat exchanger relating heat exchanger effectiveness to fluid A and fluid B flow rates, wherein fluid A has a lower heat capacity rate than fluid B, in accordance with an aspect of the present invention.
Figure 6B:
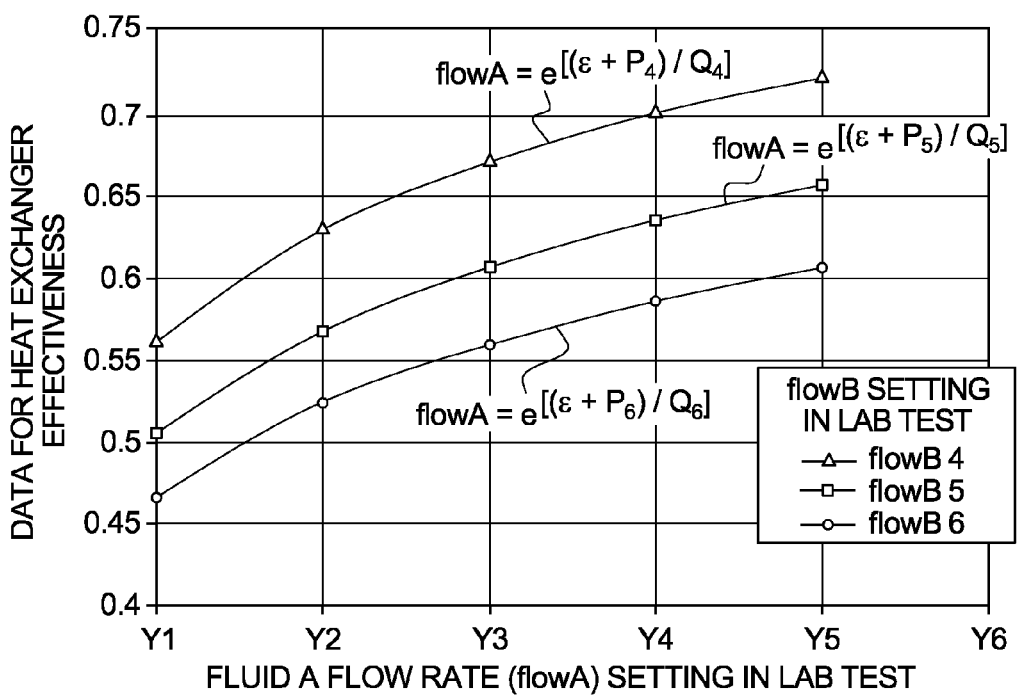
FIG. 6B is a graph of pre-characterized correlation data relating heat exchanger effectiveness to fluid A and fluid B flow rates, wherein fluid B has a lower heat capacity rate than fluid A, in accordance with an aspect of the present invention.

FIGS. 6A & 6B illustrate graphical representations of pre-characterized correlation data collected for a generic heat exchanger, such as depicted in FIG. 5. FIG. 6A depicts correlation data for the condition where fluid A flow rate has a lower heat capacity rate, and FIG. 6B illustrates the condition where the fluid B flow rate has a lower heat capacity rate. The heat capacity rate is defined as the product of the fluid's volumetric flow rate, the fluid density, and the fluid specific heat. The density and specific heat are thermophysical quantities of the fluids, which are readily available in heat transfer handbooks or other such technical sources. In both FIGS. 6A & 6B, heat exchanger effectiveness is plotted on the y-axis versus fluid A flow on the x-axis, and several curves are generated for different values of fluid B flow rate. The numeric quantities on the x-axis represent various flow settings during laboratory testing for the fluid A loop (0 . . . X10, or Y1 . . . Y6), and the flow rate setting flowB 2 is greater than the flow rate setting flowB 1, flowB 3 is greater than the flow rate setting flowB 2, etc. (again, by way of example only).

A significant thermal performance metric for any heat exchanger is its effectiveness. Effectiveness in this instance is defined as the ratio of the actual heat transferred from one fluid stream to another, to the theoretical maximum heat transfer possible for certain given inlet fluid temperature values. Effectiveness is a measure of how well a given heat exchanger is designed, and how well the heat exchanger performs under certain input conditions (e.g., flow rates). This is a characteristic of the heat exchanger, and is determined by its physical design, the thermophysical properties of the materials that are used in its construction, the thermophysical properties of the fluids that flow through it, and the heat capacity rates of the fluids flowing through the device. In practical terms, effectiveness may be calculated using the ratio of two temperature difference terms. The numerator is the absolute temperature change in the fluid stream which has the smaller of the two heat capacity rates, with the heat capacity rate being calculated as the product of the volumetric flow rate, the fluid specific heat, and the density. The denominator is the temperature difference between the fluid at the inlet of the hot stream and the fluid at the inlet of the cold stream. The numerical value of the denominator represents the maximum available temperature difference that is driving the heat exchange. Thus, for the cases shown in FIG. 6A, the effectiveness can be calculated using the ratio of $(T_{A2}-T_{A1})$ to $(T_{B1}-T_{A1})$, when fluid A is the cold stream fluid. For the cases shown in FIG. 6B, effectiveness is the ratio of $(T_{B1}-T_{B2})$ to $(T_{B1}-T_{A1})$, when fluid B is the hotter of the two fluid streams. Whether the fluid stream is hot or cold changes the equations of the numerator and the denominator to maintain a positive sign (while using the same parameters).

The curves of FIGS. 6A & 6B have different shapes because the fluid A flow rate impacts heat exchanger effectiveness differently in the two cases, i.e., when fluid A has the lower heat capacity rate (FIG. 6A), versus when fluid A has the higher heat capacity rate (FIG. 6B). Based upon heat exchanger theory, it is known that the effectiveness of a heat exchanger is inversely dependent on the ratio of the fluid heat capacity rates (smaller over the larger). Thus, in FIG. 6A, as fluid A flow rate is increased for a fixed fluid B flow rate, the heat capacity rate ratio becomes larger, and the effectiveness reduces. In FIG. 6B, as fluid A flow rate increases, its heat capacity rate also increases, and the ratio becomes smaller, thus resulting in a higher heat exchanger effectiveness. Both FIGS. 6A & 6B display three equations each (by way of example only), which describe the relationship from the correlation data allowing the estimation of fluid A flow rate when the effectiveness and fluid B flow rate are known. Knowledge of fluid B flow rate is needed to know which set of constants to use, such as the constants $R_i$, $S_i$ in the case of FIG. 6A, or $P_i$, $Q_i$ in the case of FIG. 6B, which are functions of the fluid B flow rate. For example, in FIG. 6A, for a fluid B flow rate of flowB 1, the corresponding constants are $R_1$ and $S_1$. Similarly, in FIG. 6B, if the fluid B flow rate is flowB 4, the corresponding constants are $P_4$ and $Q_4$.

The equations of the form shown in FIGS. 6A & 6B, derived via laboratory testing, can be used in accordance with the invention described herein to calculate the correct fluid A and fluid B flow rates when the temperatures at the air inlets $(T_{A1}, T_{B1})$ and outlets $(T_{A2}, T_{B2})$ of the two fluid loops of the heat exchanger are known.

FIGS. 7A-7D are a graphical depiction of the steps followed to converge on a correct flow rate for fluid A and fluid B, when fluid heat capacity rate of fluid A is lower than that of fluid B. The actual value of effectiveness is a known, determined quantity, as is the correct value for the ratio of the smaller to the larger fluid heat capacity rates (i.e., the heat capacity rate ratio (C)). In the case of FIGS. 7A-7D, this ratio is equal to the fluid A heat capacity rate divided by the fluid B heat capacity rate. How these quantities are calculated is described in greater detail below with reference to the flowchart of FIGS. 9-13.

Figure 7A:
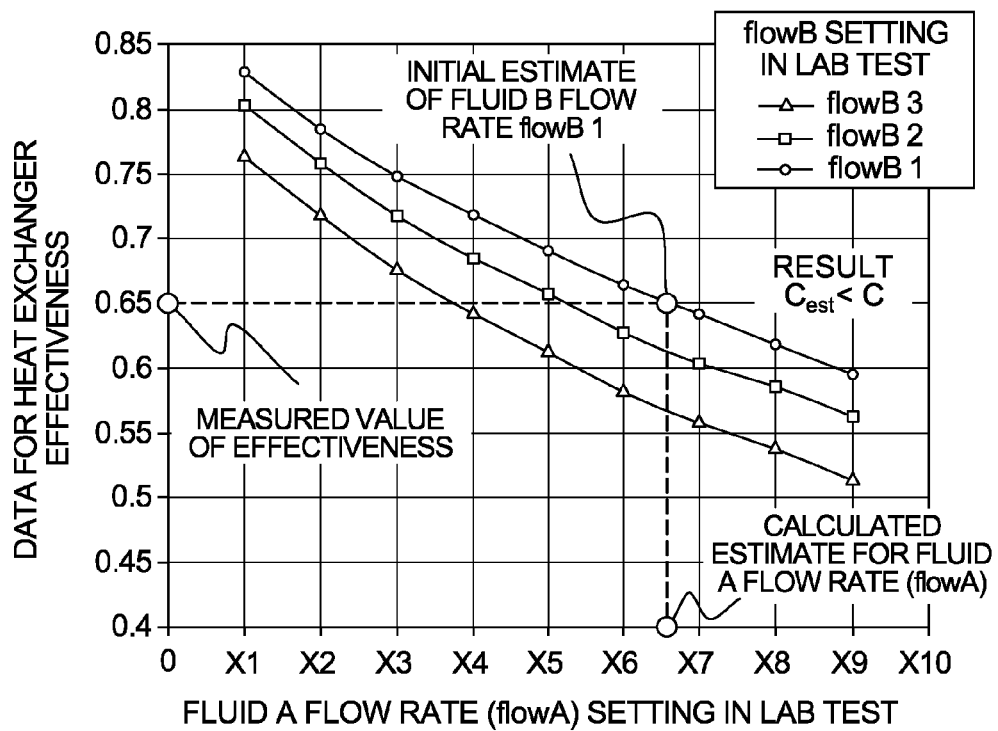
FIGS. 7A-7D graphically illustrate one example of the use of the pre-characterized correlation data of FIG. 6A and a stepwise estimating of the flow rates of fluid B and fluid A, and interpolating of actual flow rates for fluid B and fluid A, in accordance with an aspect of the present invention.
Figure 7B:
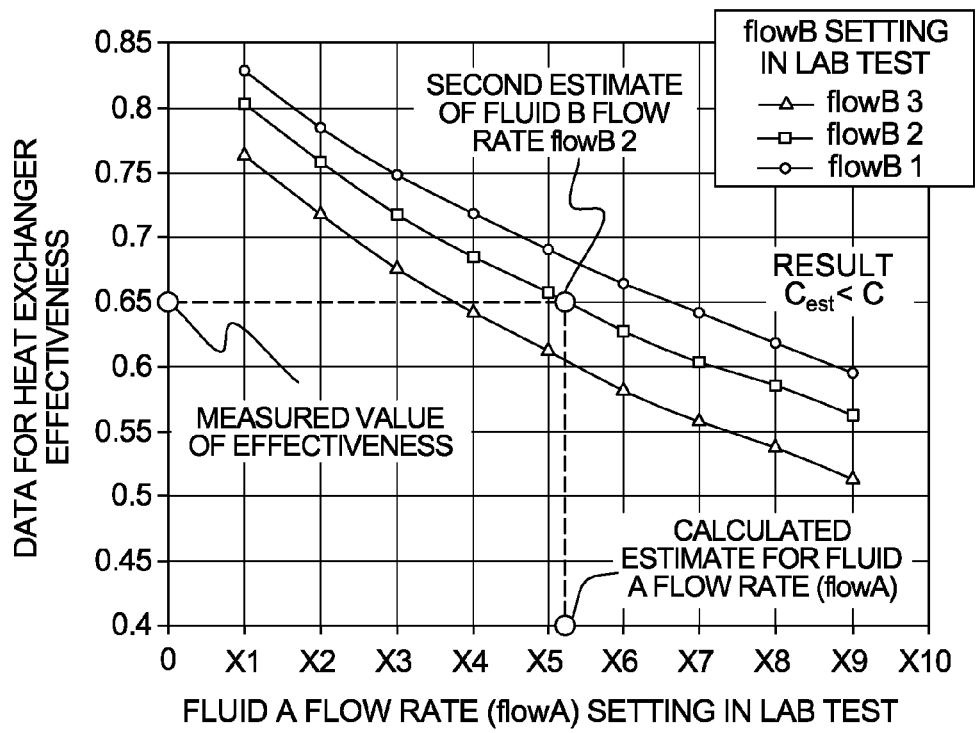
Figure 7C:
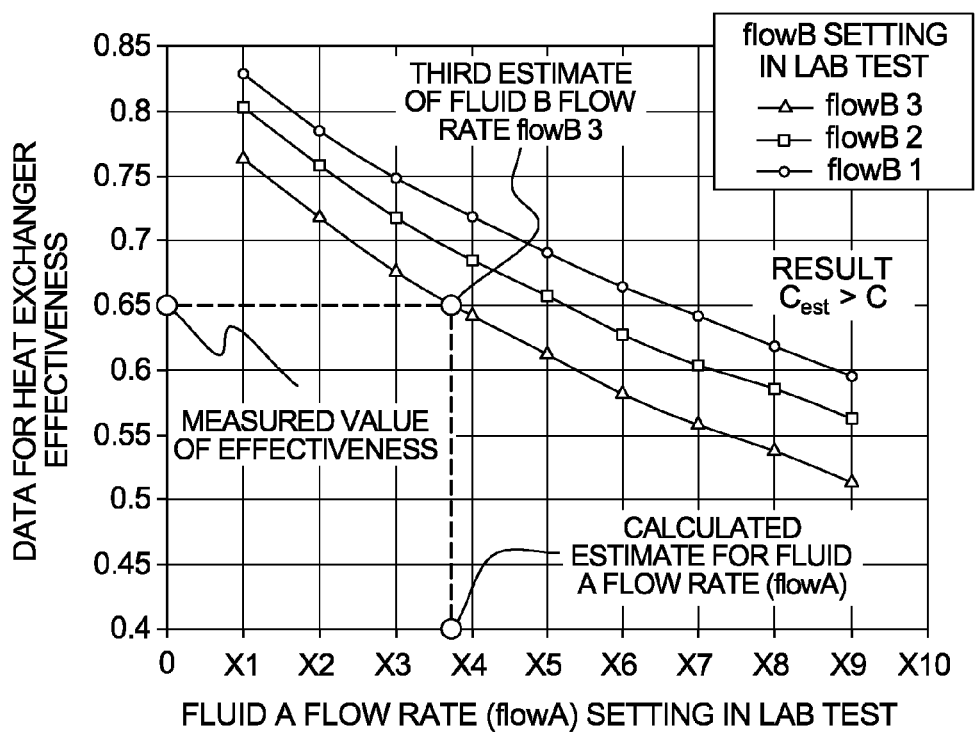
Figure 7D:
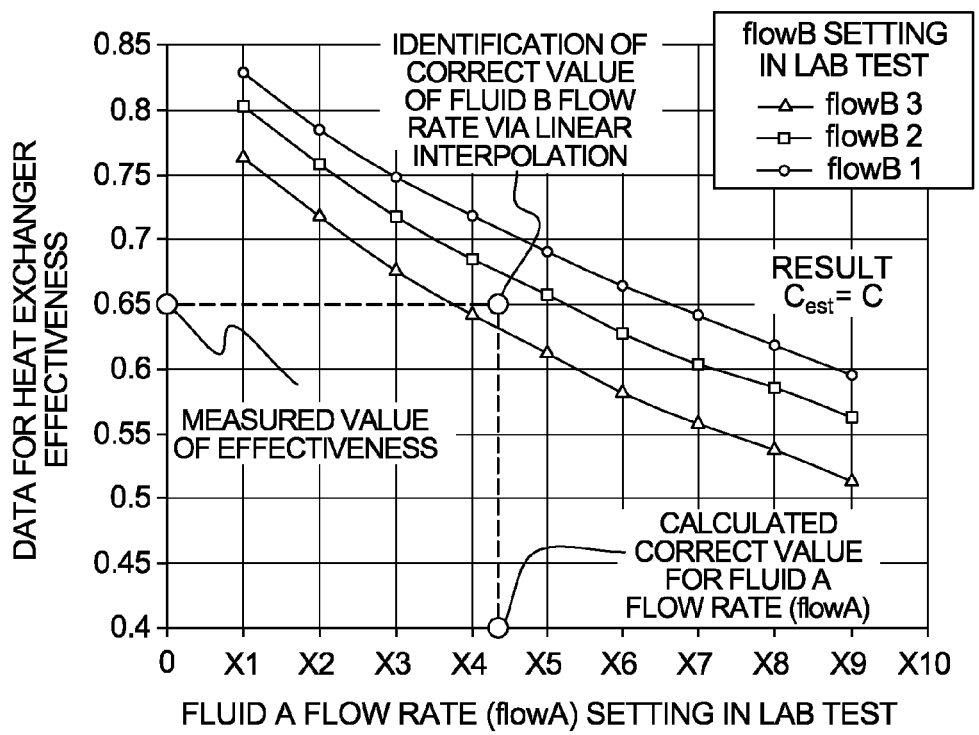

In a first step, illustrated in FIG. 7A, an initial estimate of flowB 1 is made for fluid B flow rate, and the associated constants $R_1$ and $S_1$ are obtained, for example, via a lookup table using the pre-characterized correlation data illustrated in FIG. 6A. Using these constants and the known value of effectiveness, the corresponding flow rate of fluid A is calculated. Using the estimated value of fluid B flow rate, and the calculated value of fluid A flow rate, the two fluid heat capacity rates are computed, and then the estimated heat capacity rate ratio ($C_{est}$) is calculated. In FIGS. 7A-7D, the upper lines are for the higher fluid B flow rates (i.e., flowB 1>flowB 2>flowB 3), and therefore, the initial estimate of flowB 1 results in a low value of the calculated heat capacity rate ratio ($C_{est}$). In FIG. 7B, a second step is illustrated, wherein a second estimate of fluid B flow rate, flowB 2, also results in a low value of the estimated heat capacity rate ratio ($C_{est}$) when compared to the true, measured heat capacity rate ratio (C). In FIG. 7C, a further step is illustrated, wherein a new estimate of fluid B flow rate of flowB 3 results in a high value for the calculated heat capacity rate ratio ($C_{est}$). Thus, two bounding values of fluid B flow rate are identified. In FIG. 7D, a further step of interpolation leads the process to a correct value of fluid B flow rate, as well as the correct values of the R and S constants, and thus the correct value for fluid A flow rate. The identification of the correct flow rates results in the calculated heat capacity rate ratio ($C_{est}$) being exactly equal to the determined actual capacity ratio (C) for the heat exchanger.

FIGS. 8A-8D are a graphical depiction of the various steps required to converge on a correct flow rate for fluid A and fluid B when fluid B heat capacity rate is lower than that of fluid A. The actual value of effectiveness is again a known, determined quantity (as explained below), as is the correct value for the ratio of the smaller to the larger fluid heat capacity rates. In the case of FIGS. 8A-8D, this ratio is equal to the fluid B heat capacity rate divided by the fluid A heat capacity rate. How these quantities are calculated is described in greater detail below with reference to FIGS. 9-13.

Figure 8A:
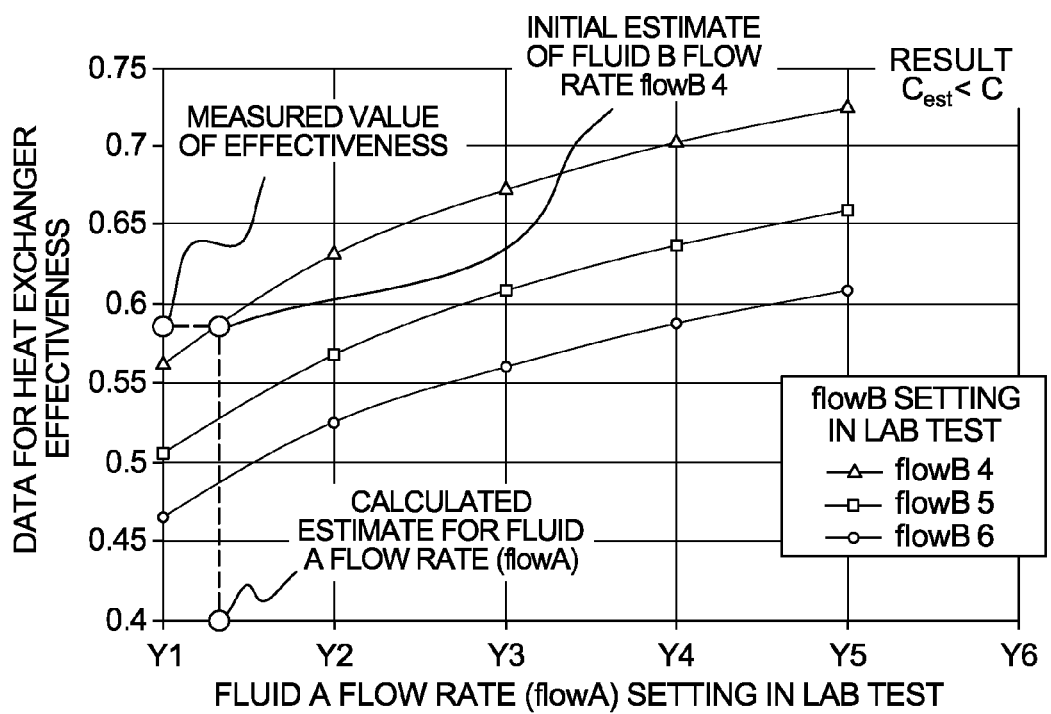
FIGS. 8A-8D graphically illustrate one example of the use of the pre-characterized correlation data of FIG. 6B, and a stepwise analyzing of the flow rates of fluid B and fluid A and interpolating of actual fluid B and fluid A flow rates, in accordance with an aspect of the present invention.

In a first step illustrated in FIG. 8A, an initial estimate of flowB 4 is made for the fluid B flow rate, and the associated constants $P_4$ and $Q_4$ are identified, for example, via a lookup table, from the pre-characterized correlation data of FIG. 6B. Using these constants, and the determined value of the effectiveness, the fluid A flow rate is calculated. Using the estimated fluid B flow rate and the calculated fluid A flow rate, the two fluid heat capacity rates are computed, and then the estimated heat capacity rate ratio ($C_{est}$) is determined. In FIGS. 8A-8D, the upper lines are for the lower fluid B flow rates, i.e., flowB 4<flowB 5<flowB 6, etc. Therefore, the initial estimate results in a low value of the calculated heat capacity rate ratio ($C_{est}$).

Figure 8B:
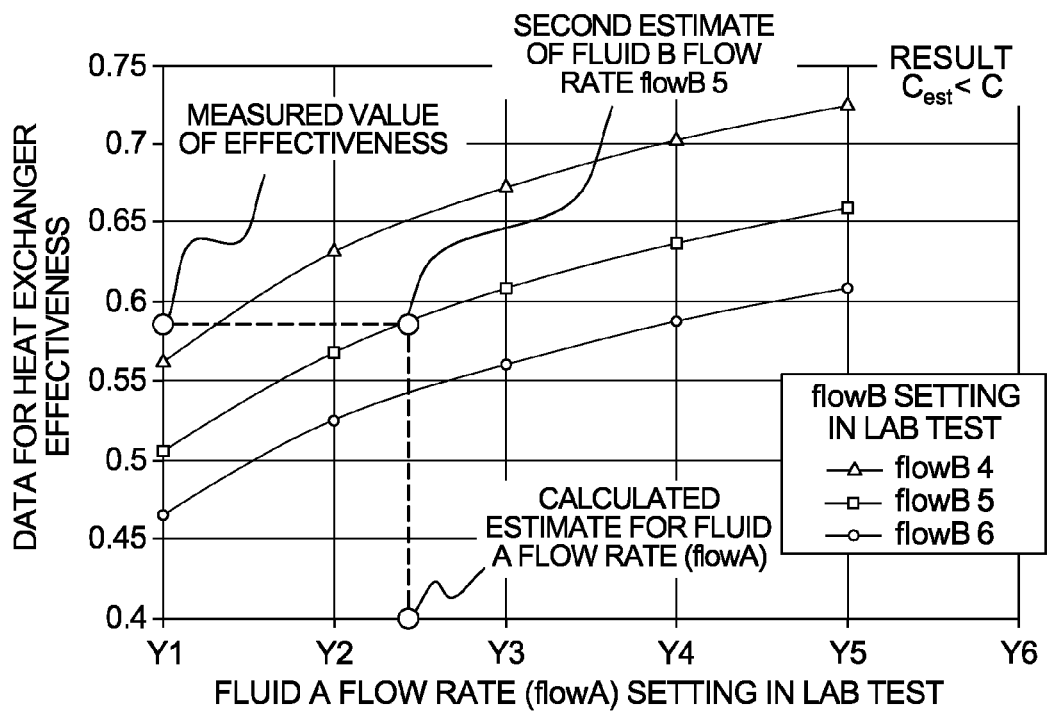
Figure 8C:
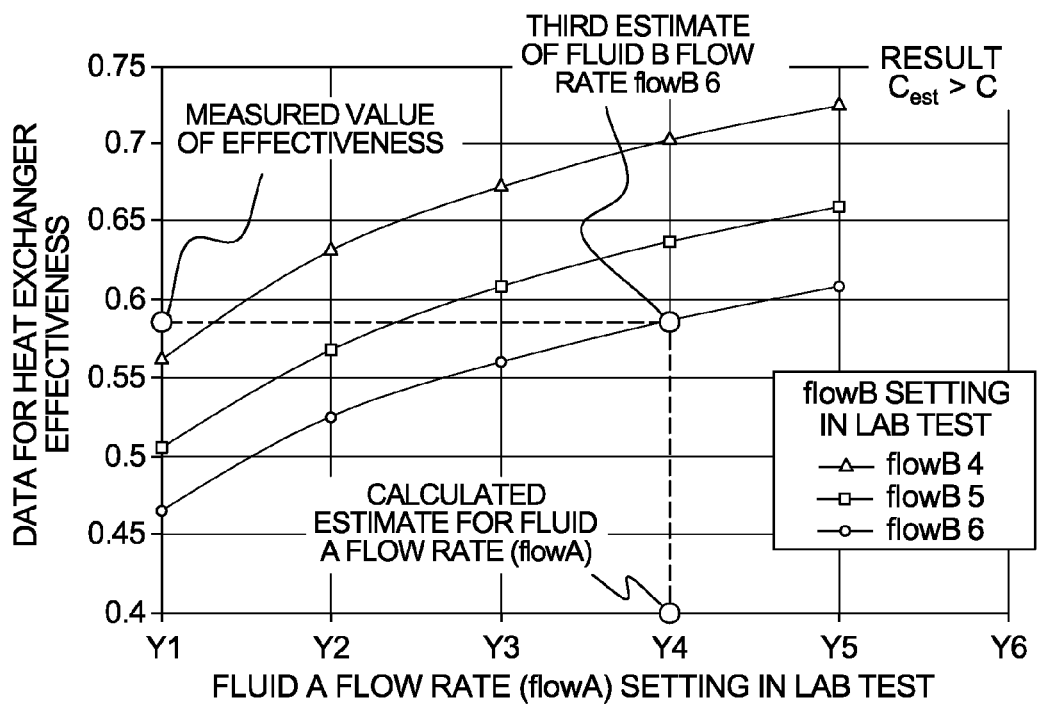
Figure 8D:
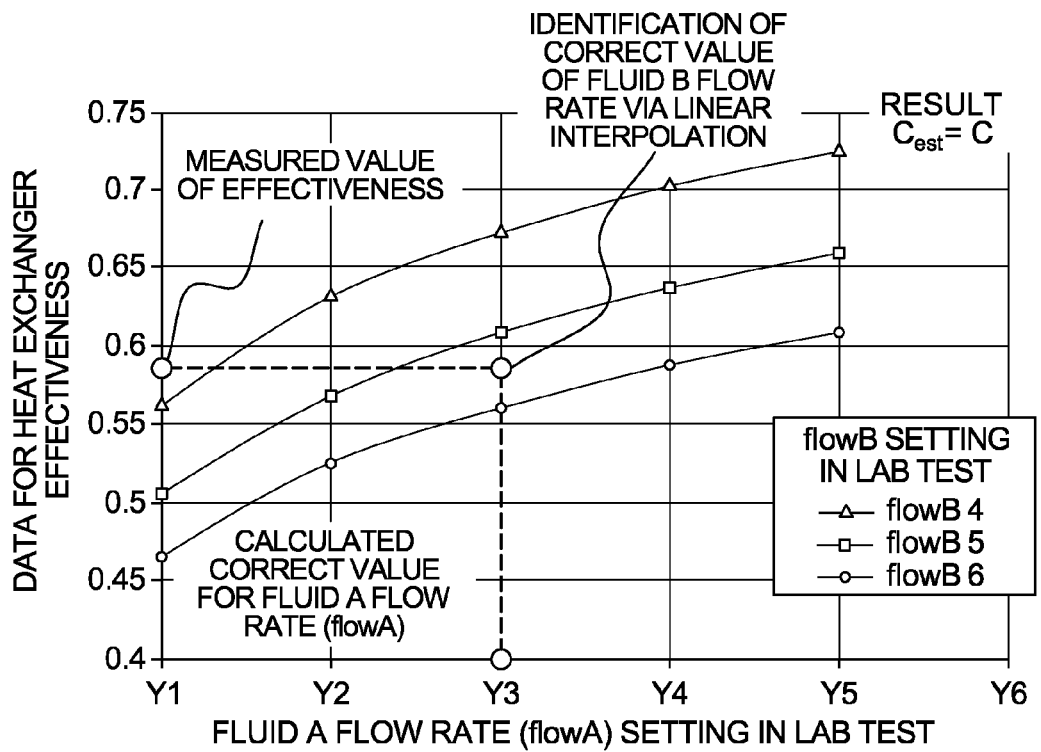

In FIG. 8B, a second step is illustrated, wherein a second estimate for fluid B flow rate (i.e., flowB 5), also results in a low value of the heat capacity rate ratio ($C_{est}$) when compared to the true capacity ratio (C). In FIG. 8C, a third step is illustrated, where a new estimate of fluid B flow rate, flowB 6, results in a high value for the calculated heat capacity rate ratio ($C_{est}$). Thus, the two bounding values of fluid B flow rate are identified. In FIG. 8D, a further step of interpolation leads the process to the correct value of fluid B flow rate, the correct values of the P and Q constants, and thus, the correct value for fluid A flow rate. The identification of the correct flow rates, again results in the calculated heat capacity rate ratio ($C_{est}$) being equal to the actual determined capacity ratio (C).

FIGS. 9-13 illustrate one embodiment of a heat exchanger monitoring process, in accordance with an aspect of the present invention. The flowchart of these figures comprises processing embedded within the monitor unit which allows temperature sensor data to be converted to heat exchanger fluid flow rates, and subsequently output, for example, by display, at the monitor unit. A site engineer can then periodically employ the outputted fluid flow rates to verify proper functioning of the heat exchanger or fluid distribution network supplying the heat exchanger. Additionally, the determined fluid flow rates through the heat exchanger can be employed to determine the heat exchange rate between a fluid A loop and fluid B loop of the heat exchanger. This information can be employed, for example, to monitor heat dissipation rate of a particular electronics rack within the data center. The information can also be employed in evaluating total load on the one or more air-conditioning units of a data center to determine how close to total cooling capacity the data center is being operated. This information can be useful for future planning purposes.

FIG. 9 illustrates an initial phase of the heat exchanger monitoring process 900. As a first step, the monitor or control unit obtains data from the various temperature sensors 901. Specifically, the fluid A inlet temperature $T_{A1}$, fluid A outlet temperature $T_{A2}$, fluid B inlet temperature $T_{B1}$, and fluid B outlet temperature $T_{B2}$ are obtained. In a next step, a check is made to determine whether fluid A or fluid B is the hot stream, that is, whether $T_{A1}$ is greater than $T_{B1}$ 902. If "yes", then the control unit determines a first set of derived parameters 904. This first set of derived parameters includes $\Delta T_{inlet}$, $\Delta T_A$, and $\Delta T_B$. These parameters, which are defined in Table 1 below, are also determined by the control unit if $T_{A1}$ is not greater than $T_{B1}$, only the difference quantities are calculated with the sequence in parameters switched to ensure a positive sign for the temperature differences 906. In a next step, the temperature difference between $T_{A1}$ and $T_{A2}$ is compared to that between $T_{B1}$ and $T_{B2}$ 908. Since the heat lost or gained by one fluid is equal to the heat loss or gain of the other fluid, this comparison yields knowledge regarding which fluid loop (A or B) has the lower heat capacity rate. The fluid loop with the lower heat capacity rate experiences a larger temperature difference across its inlet and outlet. If the comparison carried out in step 908 yields a positive result, then fluid A has a lower heat capacity rate 910 and processing proceeds to FIG. 10. Otherwise, if the comparison carried out in step 908 yields a negative result, then fluid B has a lower heat capacity rate than fluid A 912, and processing proceeds to FIG. 12.

Continuing first with FIG. 10, the control unit initially determines a second set of derived parameters 920. This second set of parameters includes the effectiveness ($\epsilon$) and the true or actual heat capacity rate ratio (C) of the heat exchanger. The heat exchanger heat capacity rate ratio is the ratio of the smaller fluid heat capacity rate to the larger fluid heat capacity rate. In the case of FIG. 10, fluid A has the lower heat capacity rate (as determined above in connection with FIG. 9). Processing then identifies bounding values for the fluid B flow rate using the correlated data 922. This identification of bounding values includes several sub-steps, as illustrated in FIG. 10 and described below.

In a first sub-step, the fluid B flow rate is set to an estimated $flowB_i$ value, which is a pre-characterized fluid B flow rate, for example, flowB, may be the largest fluid B flow rate tested in the pre-characterizing laboratory testing of the heat exchanger 924. This value of fluid B flow rate is chosen to be much larger than the specified fluid B flow rate and is a reasonable estimate of the largest fluid B flow rate that the heat exchanger would be expected to experience in the field. Via a lookup table, the pre-characterized correlation data is employed to obtain constants $R_i$ and $S_i$, which are associated with the equation relating fluid A flow rate to heat exchanger effectiveness for the fluid B flow rate of $flowB_i$. Using the effectiveness calculated above in step 920, and the identified constants $R_i$ and $S_i$, the fluid A flow rate, $flowA_i$ is determined 926. In the next sub-step, the two estimated values for the fluid heat capacity rates (for fluid A and fluid B) are determined, and these values are used to estimate a value for the heat capacity rate ratio ($C_{est,\ i}$) 928. Since the process began with a high estimated value for fluid B flow rate, and fluid B heat capacity rate is the denominator of the equation for the heat capacity rate ratio (for fluid B), this initial estimated value for heat capacity rate ratio ($C_{est}$) is likely to be smaller than the actual heat capacity rate ratio (C). In the next sub-step, the comparison is made between the estimated and the actual heat capacity rate ratios 930. A positive result leads to counter i being incremented by 1 932, and processing returning to step 924, which results in the fluid B flow rate being incremented in a sequential manner through the pre-characterized correlation data. This process continues until a fluid B flow rate is identified for which the estimated heat capacity rate ratio ($C_{est}$) is larger than the actual heat capacity rate ratio (C). If the result occurs for a count i, then the fluid B flow rates, fluid $B_{i-1}$, and fluid $B_i$ are the bounding values for the correct fluid B flow rate. A negative result in sub-step 930 leads processing to check whether the value of the counter is greater than 1 934. If "no", then the first estimated value of fluid B flow rate is actually lower than the real fluid B flow rate. This in turn means that the heat exchanger is running out of specification (on the high side) with respect to the fluid B flow rate, and a corresponding warning 936 is issued, before processing returns to FIG. 9. If i is other than 1, then the two bounding flow rates for the fluid B flow rate have been identified, and processing proceeds to FIG. 11.

Figure 11:
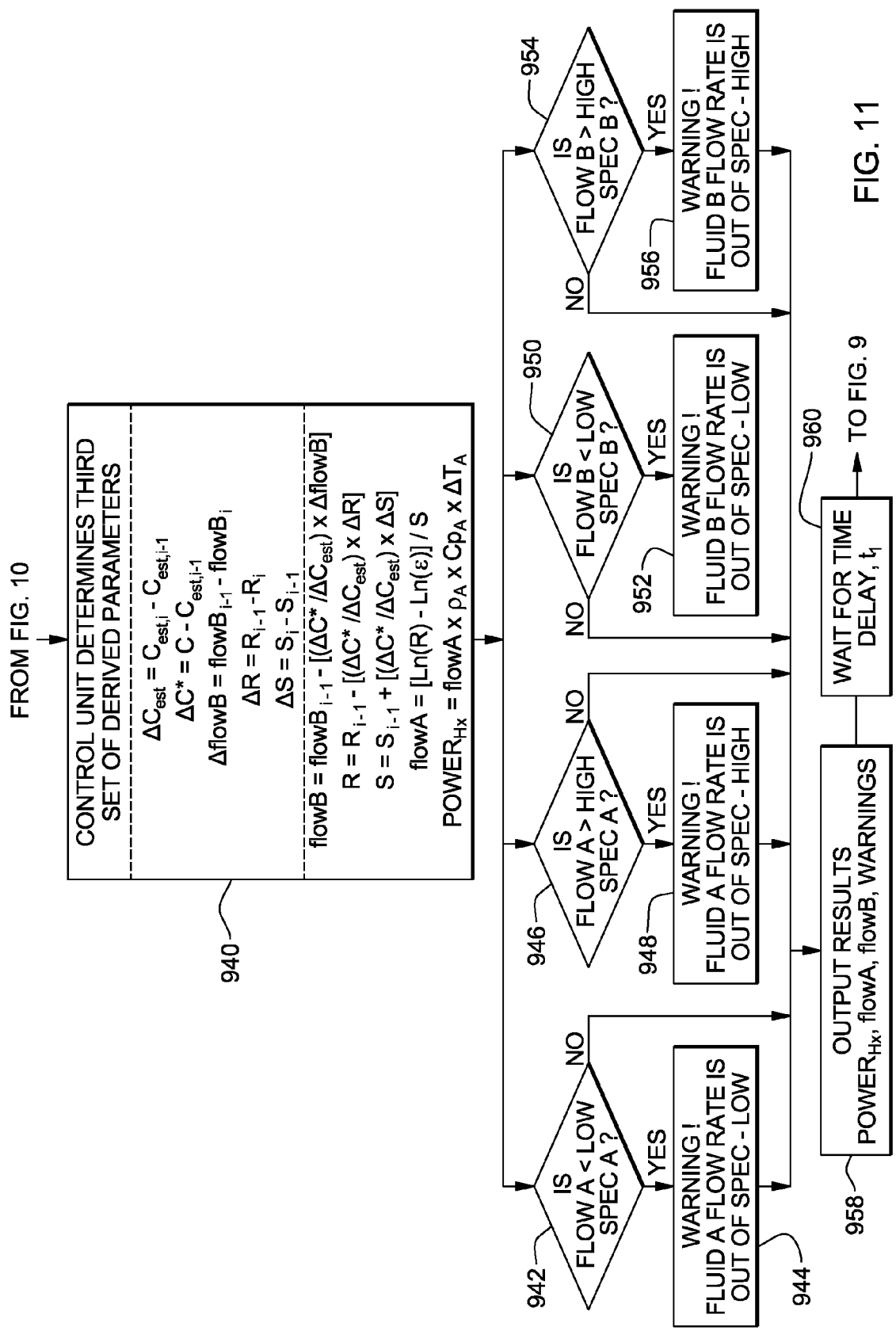

As shown in FIG. 11, the control unit initially determines a third set of derived parameters 940. These derived parameters include the difference between the heat capacity rate ratio for the upper bound of fluid B flow rate ($C_{est,\ i-1}$) and the heat capacity rate ratio for the lower bound of fluid B ($C_{est,\ i}$). The difference between the heat capacity rate ratio for the upper bound of fluid B ($C_{est,\ i-1}$) and the actual heat capacity rate ratio (C) is also determined. The ratio of these two differences represents the fractional "distance" to the location of the actual values (flowB, R & S) that needs to be traversed from the i-1 lower bound values. In subsequent sub-steps, the actual values of flowB, R & S are determined using this fractional difference. Then, using the correct values for R and S, and the knowledge of the actual effectiveness, the actual fluid A flow rate is determined. If desired, the heat transfer rate across the heat exchanger can also be determined as the product of flowA, the density of fluid A, the specific heat of fluid A and the inlet-to-outlet fluid A temperature difference determined via the processing of FIG. 9.

In a next step, which includes four sub-steps that may be executed in parallel, the fluid A and fluid B flow rates are compared to respective upper and lower bound specifications for each fluid loop, and a determination is made whether the flow rates are in specification or out of specification. If any of the flow rates are out of specification, then an appropriate warning message is automatically generated for output.

Specifically, processing determines whether flowA is less than a specified low fluid A flow rate 942, and if so, an appropriate fluid A flow rate out of specification-low warning is issued 944. Processing also determines whether flowA is greater than the specified high flow rate for fluid A 946, and if so, issues a warning that fluid A flow rate is out of specification (on the high side) 948. If flowB is less than the specified low fluid B flow rate 950, then a warning is issued that the fluid B flow rate is out of specification 952 (on the low side), and if flowB is greater than the specified high fluid B flow rate 954, then a warning is issued that the fluid B flow rate is out of specification (on the high side) 956. The heat transfer rate, two fluid flow rates, and any warning messages are next output, for example, displayed 958. As used herein, "output" refers to displaying, saving, printing or otherwise providing the determined results to or for use of, for example, a central administrator of the data center within which the heat exchanger being monitored resides. Processing then waits a defined time interval $t_1$ 960 before returning to automatically obtain a new set of temperature sensor readings 901 (FIG. 9), and repeating the determination of fluid A and fluid B flow rates.

Figure 12:
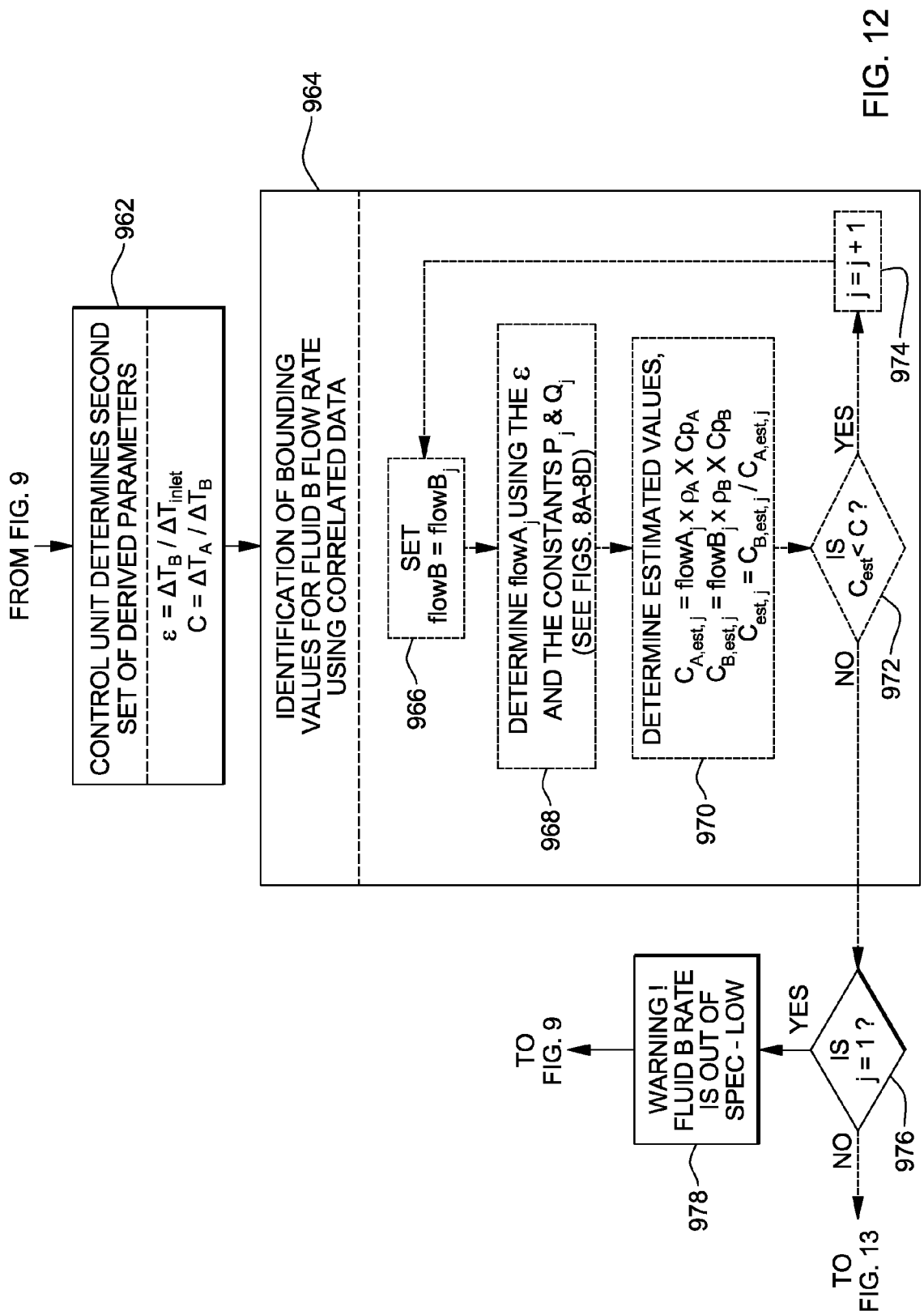
Figure 13:
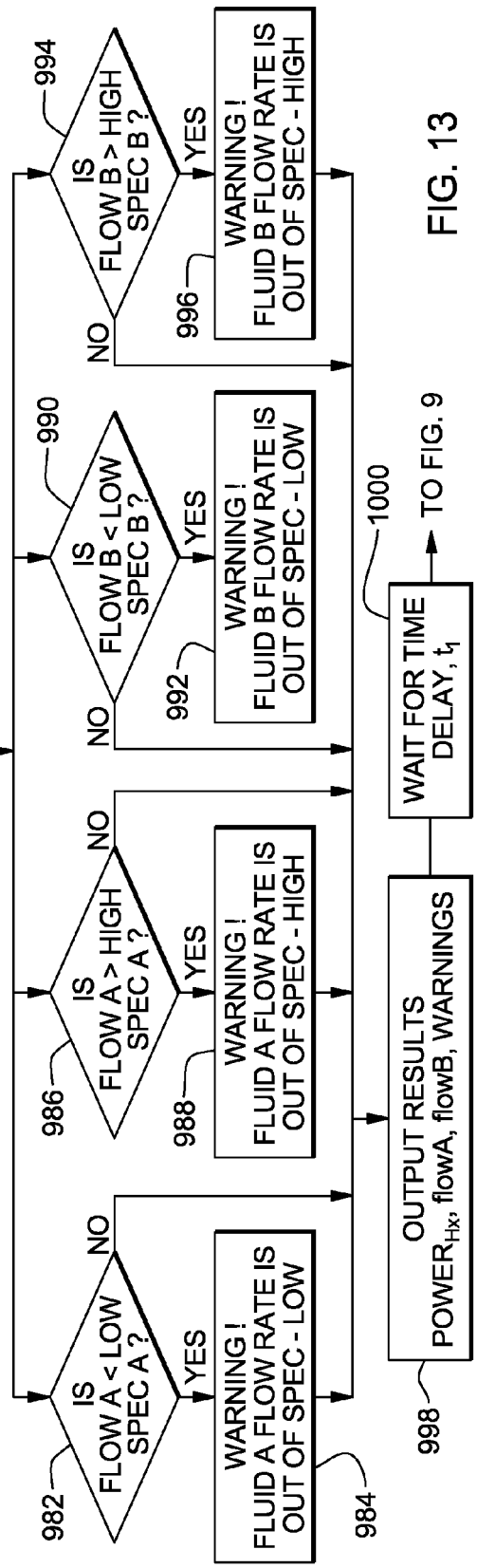

As noted above, FIGS. 10 & 11 describe processing employed when fluid A is determined to have a lower heat capacity rate than fluid B. FIGS. 12 & 13 provide the analogous processing in the event that fluid B has a lower heat capacity rate than fluid A.

As illustrated, FIG. 12 begins with the control unit determining a second set of derived parameters 962, including the heat exchanger effectiveness ($\epsilon$), and the heat exchanger heat capacity rate ratio (C). The heat exchanger heat capacity rate ratio is the ratio of the smaller fluid heat capacity rate to the larger fluid heat capacity rate. In this example, fluid B has the lower heat capacity rate, and fluid A the higher heat capacity rate. Next, the control unit employs a subroutine to determine estimated fluid B and fluid A flow rates and an estimated heat capacity rate ratio ($C_{est}$) for the heat exchanger 964. Specifically, the fluid B flow rate is set to flowB$_j$, which is a predetermined, smallest fluid B flow rate tested in the laboratory testing of the heat exchanger 966. This value of fluid B flow rate is typically lower than the specified low value and is a reasonable estimate of the lowest fluid B flow rate that the heat exchanger might experience in the field. Via a lookup table, the constants $P_j$ and $Q_j$ associated with the equation relating fluid A flow rate to the heat exchanger effectiveness (for the fluid B flow rate equal to flowB$_j$) are identified, and using the effectiveness determined above, and the identified constants $P_j$ & $Q_j$, the estimated fluid A flow rate, (flowA$_j$) is determined 968.

In a next step, the two estimated values for fluid heat capacity rates (fluid A and fluid B) are determined, and using these values, an estimated value for the heat capacity rate ratio ($C_{est}$) is determined 970. Since processing began with a low estimated value for fluid B flow rate, and the fluid heat capacity rate is in the numerator of the equation for heat capacity rate ratio, this initial estimated value of heat capacity rate ratio may be smaller than the actual ratio. In a next step 972, a comparison is thus made between the heat capacity rate ratios. If the actual heat capacity rate ratio (C) is larger than the estimated heat capacity rate ratio ($C_{est}$), then index j is incremented by 1 974, and the subroutine repeats. Thus, fluid B flow rate is incremented in a sequential manner, until a fluid B flow rate is identified for which the estimated heat capacity rate ratio ($C_{est}$) is larger than the actual heat capacity rate ratio (C). If this result occurs for counter index j, then the fluid B flow rates, flowB$_{j-1}$ and flowB$_j$ are the bounding values for the correct fluid B flow rate. A negative result in the comparison of step 972, leads to processing checking whether j is equal to 1 976. If j equals 1, then the first estimated value of fluid B flow rate is actually higher than the real fluid B flow rate. This in turn means that the heat exchanger is running below specification with respect to the fluid B flow rate, and a warning is issued that fluid B flow rate is out of specification (on the low side) 978, after which processing returns to FIG. 9. If the estimated heat capacity rate ratio is greater than the actual heat capacity rate ratio, and j is greater than 1, then the two bounding flow rates for fluid B flow rate have been identified, and processing proceeds to FIG. 13.

Referring to FIG. 13, processing initially determines a difference between the heat capacity rate ratio for the upper bound of the fluid B flow rate ($C_{est,j}$) and the heat capacity rate ratio for the lower bound of the fluid B flow rate ($C_{est\ i-1}$) 980. Next, the difference between the actual heat capacity rate ratio (C) and the heat capacity rate ratio for the lower bound of fluid B ($C_{est,\ j-1}$) is determined. The ratio of these two differences represents the fractional "distance" to the location of the actual values for flowB, P & Q that need to be traveled from the lower (j-1) bound values. In subsequent steps, the actual values of flowB, P & Q are calculated using this fractional distance. Then, using the actual values for P & Q, and the knowledge of the actual effectiveness, the actual fluid A flow rate is determined. The heat transfer rate (Power$_{Hx}$) across the heat exchanger can also be determined as the product of the flowB, the density of fluid B, the specific heat of fluid B, and the inlet-to-outlet fluid B temperature difference determined above via the processing of FIG. 9.

In a next step, which includes four sub-steps that may be executed in parallel, the fluid A and fluid B flow rates are compared to upper and lower bound specifications for each fluid loop, and a determination is made whether the flow rates are in specification or out of specification. If any of the fluid flow rates are out of specification, then an appropriate warning message is generated. Specifically, processing determines whether fluid flowA is less than a specified low flow rate 982, and if so, generates a warning that fluid A flow rate is out of specification (on the low side) 984. In addition, processing determines whether flowA is greater than a specified high flow rate 986, and if "yes", generates a warning that fluid A flow rate is out of specification (on the high side) 988. Processing also determines whether fluid B flow rate is less than a specified low flow rate 990, and if "yes", generates a warning that fluid B flow rate is out of specification (on the low side) 992. Further, processing determines whether flowB is greater than a specified high flow rate 994, and if "yes", generates a warning that fluid B flow rate is out of specification (on the high side) 996.

The heat transfer rate (Power$_{Hx}$), two fluid flow rates (flowA, flowB) and any warning message are the output 998, for example, to a data center administrator or site engineer for possible adjustment of one or more of the flow rates, or to take action based upon one or more warnings generated. Processing then waits a defined time interval $t_1$ 1000, before automatically returning to obtain a new set of temperature readings 901 (FIG. 9) and repeating the determination of fluid A and fluid B flow rates.

TABLE 1

| Variable/Equation | Definition |
|---|---|
| $T_{A1}$ | Fluid temperature measured via sensor located at inlet to loop A, °C. |
| $T_{A2}$ | Fluid temperature measure via sensor located at outlet to loop A, °C. |
| $T_{B1}$ | Fluid temperature measured via sensor located at inlet to loop B, °C. |
| $T_{B2}$ | Fluid temperature measured via sensor located at outlet to loop B, °C. |
| $\Delta T_A$ | Absolute difference between inlet and outlet fluid temperatures of loop A, °C. |
| $\Delta T_B$ | Absolute difference between inlet and outlet fluid temperatures of loop B, °C. |
| $\Delta T_{inlet}$ | Absolute difference in temperature between the inlets of loop A and B, °C. |
| flowA | Volumetric fluid flow rate in loop A, m³/s. |
| flowB | Volumetric fluid flow rate in loop B, m³/s. |
| R, S, P, Q | Constants used to fit functions to lab data relating effectiveness and the fluid flow rate through loop A of the heat exchanger. Values for these constants depend on value of the fluid B flow rate. |
| C | True value for the ratio of the minimum fluid heat capacity rate to the maximum fluid heat capacity rate. |
| $C_{est}$ | Estimated value for the ratio of the minimum fluid heat capacity rate to the maximum fluid heat capacity rate. |
| $\Delta C_{est}$ | Bounding distance for the value of the C between $(i-1)^{th}$ and $i^{th}$ iteration. |
| $\Delta C^*$ | True distance for the true value of C from $(i-1)^{th}$ iteration. |
| $\Delta R, \Delta S, \Delta P, \Delta Q$ | Bounding distance for true values of constants R, S, P and Q, respectively, between $(i-1)^{th}$ and $i^{th}$ iteration. |
| $\Delta$flowB | Bounding distance for the true value of volumetric flow rate in loop B, between $(i-1)^{th}$ and $i^{th}$ iteration, m³/s. |
| $C_{A, est}$ | Estimated heat capacity rate of the fluid in loop A, W/K. |
| $C_{B, est}$ | Estimated heat capacity rate of the fluid in loop B, W/K. |
| $\epsilon$ | True value for the heat exchanger effectiveness. It represents the ratio of the actual heat exchanged between the fluid streams versus the maximum possible heat that could be exchanged. This is a characteristic of the heat exchanger and is determined by its physical design, the thermophysical properties of the materials that are used in its construction, the thermophysical properties of the fluids that flow through it, and the mass flow rates of the fluids that flow through the device. |
| $Power_{Hx}$ | Heat exchange rate between the loop A and loop B of the heat exchanger, W. |
| $\rho A$ | Mass density of fluid in loop A, kg/m³. |
| $C_{\rho A}$ | Specific heat of fluid in loop A, J/kg-K. |
| $\rho B$ | Mass density of fluid in loop B, kg/m³. |
| $C_{\rho B}$ | Specific heat of fluid in loop B, J/kg-K. |
| i | Counter in logic loops. |
| low spec A | Lowest allowable value of volumetric flow rate in loop A, m³/s. |
| high spec A | Highest allowable value of volumetric flow rate in loop A, m³/s. |
| low spec B | Lowest allowable value of volumetric flow rate in loop B, m³/s. |
| high spec B | Highest allowable value of volumetric flow rate in loop B, m³/s. |
| $t_1$ | Time delay after the logic is executed and a new execution is started, s. |

More particularly, the heat exchanged between the two fluid streams via the heat exchange device is given by:

$$q = \epsilon \times C_{min} \times \Delta T_{inlet} \quad (1)$$

Where $\epsilon$ is the heat exchanger effectiveness, and $\Delta T_{inlet}$ is the inlet temperature difference that is driving the heat exchange between the two fluid streams that are flowing in the heat exchanger. Also, in equation (1) above, the parameter $C_{min}$ is the minimum of the two fluid stream heat capacity rates. If the heat capacity rate of the fluid in loop A is the lower of the two, then equation (1) becomes:

$$q = \epsilon \times C_A \times \Delta T_{inlet} \quad (2)$$

The heat transferred to the fluid in loop A will change the fluid temperature, between the inlet and the outlet, and can be calculated using:

$$q = C_A \times \Delta T_A \quad (3)$$

Combining equations (2) and (3) to solve for $\epsilon$, yields, $$\epsilon = \Delta T_A / \Delta T_{inlet} \quad (4)$$

If the fluid loop B has the lower of the two heat capacity rates, then equation (4) becomes:

$$\epsilon = \Delta T_B / \Delta T_{inlet} \quad (5)$$

This fluid loop A flow rate can be expressed as a function of the effectiveness and is a function of the fluid loop B flow rate and can be calibrated in the lab to yield the following functions:

$$\text{flow}A = [\text{Ln}(R) - \text{Ln}(\epsilon)]/S \text{ if flow}B > \text{flow}A \quad (6)$$

$$\text{flow}A = \epsilon^{[(\epsilon+P)/Q]} \text{ if flow}A > \text{flow}B \quad (7)$$

Where R, S, P and Q are constants which depend on the value of flow B.

Once the fluid flow rates are known, then the heat exchanged between the two loops of the heat exchanger can be calculated using:

$$\text{Power}_{Hx} = C_A \times \Delta T_A = C_B \times \Delta T_B \tag{8}$$

The detailed description presented above is discussed in terms of procedures which can be executed on a computer, a network or a cluster of computers. These procedural descriptions and representations are used by those skilled in the art to most effectively convey the substance of their work to others skilled in the art. They may be implemented in hardware or software, or a combination of the two.

A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as closing or opening, which are commonly associated with manual operations performed by a human operator. No such intervention of a human operator is necessary in the operations described herein which form part of the present invention; the operations may be implemented as automatic machine operations. Useful machines for performing the operations of the present invention include general purpose digital computers or similar devices.

Aspects of the invention are preferably implemented in a high level procedural or object-oriented programming language to communicate with a computer. However, the inventive aspects can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention and/or to structure its components in accordance with a system of the invention.

Aspects of the invention may be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of monitoring a heat exchanger, the method comprising:

pre-characterizing the heat exchanger to generate pre-characterized correlation data for the heat exchanger, the pre-characterized correlation data comprising data correlating effectiveness of the heat exchanger to flow rates of a first fluid through the heat exchanger and flow rates of a second fluid through the heat exchanger, wherein when operational, heat is transferred across the heat exchanger between the first fluid and the second fluid;

sensing, when operational, inlet and outlet temperatures of the first fluid passing through the heat exchanger, and inlet and outlet temperatures of the second fluid passing through the heat exchanger;

automatically determining at least one of flow rate of the first fluid through the heat exchanger or flow rate of the second fluid through the heat exchanger, the automatically determining employing the pre-characterized correlation data and the sensed inlet and outlet temperatures of the first fluid and the sensed inlet and outlet temperatures of the second fluid; and outputting the determined flow rate of the first fluid or the flow rate of the second fluid through the heat exchanger.

2. The method of claim 1, wherein the automatically determining comprises determining flow rate of the first fluid through the heat exchanger and flow rate of the second fluid through the heat exchanger employing only the pre-characterized correlation data and the sensed inlet and outlet temperatures of the first fluid and the sensed inlet and outlet temperatures of the second fluid.

3. The method of claim 2, wherein the pre-characterizing comprises relating known flow rates of the first fluid through the heat exchanger and known flow rates of the second fluid through the heat exchanger to effectiveness of the heat exchanger, and wherein the pre-characterizing further comprises generating one or more equations relating flow rate of at least one of the first fluid or the second fluid to effectiveness of the heat exchanger.

4. The method of claim 1, wherein the automatically determining comprises employing the sensed inlet and outlet temperatures of the first fluid and the sensed inlet and outlet temperatures of the second fluid in obtaining effectiveness of the heat exchanger and a heat capacity rate ratio for the heat exchanger, and wherein the method further comprises employing the effectiveness and the heat capacity rate ratio in comparison with the pre-characterized correlation data in determining flow rate of the first fluid and flow rate of the second fluid through the heat exchanger.

5. The method of claim 4, further comprising employing the sensed inlet and outlet temperatures of the first fluid and the sensed inlet and outlet temperatures of the second fluid in determining whether the first fluid or the second fluid has a lower heat capacity rate, and wherein the automatically determining comprises employing a first set of pre-characterized correlation data if the first fluid has a lower heat capacity rate than the second fluid, or employing a second set of pre-characterized correlation data if the second fluid has a lower heat capacity rate than the first fluid.

6. The method of claim 5, wherein the automatically determining comprises:
   identifying bounding values for at least one of the first fluid flow rate or the second fluid flow rate using the pre-characterized correlation data, and wherein the using comprises:
      estimating the second fluid flow rate to be one flow rate of the second fluid in the pre-characterized correlation data;
      estimating the first fluid flow rate using the effectiveness, and constants derived from the pre-characterized correlation data for the estimated second fluid flow rate;
      determining an estimated heat capacity rate ratio for the heat exchanger employing the estimated first fluid flow rate and the estimated second fluid flow rate; and
   wherein the identifying further comprises comparing the estimated heat capacity rate ratio for the heat exchanger to the determined heat capacity rate ratio for the heat exchanger, and if the estimated heat capacity rate ratio for the heat exchanger is less than the determined heat capacity rate ratio for the heat exchanger, repeating the using for a second fluid flow rate comprising a next flow rate of the second fluid in the pre-characterized correlation data, otherwise, identifying the currently estimated second fluid flow rate and the just prior estimated second fluid flow rate as bounding second fluid flow rates from the pre-characterized correlation data and employing the bounding second fluid flow rates in interpolating a fluid flow rate for the second fluid, and interpolating values for constants employed in relating the first fluid flow rate to heat exchanger effectiveness, and thereafter, determining the first fluid flow rate using the determined effectiveness and the interpolated constants.

7. The method of claim 6, further comprising determining heat transfer rate across the heat exchanger employing one of the determined first fluid flow rate or second fluid flow rate and outputting the heat transfer rate with the at least one of first fluid flow rate or the second fluid flow rate.

8. The method of claim 1, further comprising automatically determining whether the first fluid flow rate is below a first low specified flow rate, and if so, automatically issuing a warning that the first fluid flow rate is below the first low specified flow rate, automatically determining whether the first fluid flow rate is above a first high specified flow rate, and if so, automatically issuing a warning that the first fluid flow rate is above the first high specified flow rate, automatically determining whether the second fluid flow rate is below a second low specified flow rate, and if so, automatically issuing a warning that the second fluid flow rate is below the second low specified flow rate, or automatically determining whether the second fluid flow rate is above a second high specified flow rate, and if so, automatically issuing a warning that the second fluid flow rate is above the second high specified flow rate.

9. The method of claim 1, wherein the heat exchanger comprises a heat exchanger configured to facilitate cooling of one or more electronic components within a data center.

10. A monitoring system for a heat exchanger, the monitoring system comprising:
   a database holding pre-characterized correlation data for the heat exchanger, the pre-characterized correlation data comprising data correlating effectiveness of the heat exchanger to flow rates of a first fluid through the heat exchanger and flow rates of a second fluid through the heat exchanger, wherein when operational, heat is transferred across the heat exchanger between the first fluid and the second fluid;
   a first inlet temperature sensor for sensing inlet temperature of the first fluid passing through the heat exchanger, when operational, and a first outlet temperature sensor for sensing outlet temperature of the first fluid passing through the heat exchanger;
   a second inlet temperature sensor for sensing inlet temperature of the second fluid passing through the heat exchanger, when operational, and a second outlet temperature sensor for sensing outlet temperature of the second fluid passing through the heat exchanger; and
   a monitor unit coupled to the first and second inlet temperature sensors and the first and second outlet temperature sensors for obtaining the sensed inlet and outlet temperatures of the first fluid and the second fluid and for employing the sensed inlet and outlet temperatures of the first fluid and the second fluid and the pre-characterized correlation data in automatically determining at least one of flow rate of the first fluid through the heat exchanger or flow rate of the second fluid through the heat exchanger, and outputting the determined flow rate of the first fluid or the flow rate of the second fluid through the heat exchanger.

11. The monitoring system of claim 10, wherein the monitor unit determines flow rate of the first fluid through the heat exchanger and flow rate of the second fluid through the heat exchanger employing only the pre-characterized correlation data and the sensed inlet and outlet temperatures of the first fluid and the sensed inlet and outlet temperatures of the second fluid.

12. The monitoring system of claim 10, wherein the monitor unit employs the sensed inlet and outlet temperatures of the first fluid and the sensed inlet and outlet temperatures of the second fluid in obtaining effectiveness of the heat exchanger and a heat capacity rate ratio for the heat exchanger, and wherein the method further comprises employing the effectiveness and the heat capacity rate ratio in comparison with the pre-characterized correlation data in determining flow rate of the first fluid and flow rate of the second fluid through the heat exchanger.

13. The monitoring system of claim 12, wherein the monitor unit employs the sensed inlet and outlet temperatures of the first fluid and the sensed inlet and outlet temperatures of the second fluid in determining whether the first fluid or the second fluid has a lower heat capacity rate, and wherein the automatically determining comprises employing a first set of pre-characterized correlation data if the first fluid has a lower heat capacity rate than the second fluid, or employing a second set of pre-characterized correlation data if the second fluid has a lower heat capacity rate than the first fluid.

14. The monitoring system of claim 13, wherein the monitor unit:
identifies bounding values for at least one of the first fluid flow rate or the second fluid flow rate using the pre-characterized correlation data, and wherein the using comprises:
estimating the second fluid flow rate to be one flow rate of the second fluid in the pre-characterized correlation data;
estimating the first fluid flow rate using the effectiveness, and constants derived from the pre-characterized correlation data for the estimated second fluid flow rate;
determining an estimated heat capacity rate ratio for the heat exchanger employing the estimated first fluid flow rate and the estimated second fluid flow rate; and
comparing the estimated heat capacity rate ratio for the heat exchanger to the determined heat capacity rate ratio for the heat exchanger, and if the estimated heat capacity rate ratio for the heat exchanger is less than the determined heat capacity rate ratio for the heat exchanger, repeats the using for a second fluid flow rate comprising a next flow rate of the second fluid in the pre-characterized correlation data, otherwise, identifies the currently estimated second fluid flow rate and the just prior estimated second fluid flow rate as bounding second fluid flow rates from the pre-characterized correlation data and employs the bounding second fluid flow rates in interpolating a fluid flow rate for the second fluid, and interpolates values for constants employed in relating the first fluid flow rate to heat exchanger effectiveness, and thereafter, determines the first fluid flow rate using the determined effectiveness and the interpolated constants.

15. The monitoring system of claim 14, wherein the monitor unit further determines a heat transfer rate across the heat exchanger employing one of the determined first fluid flow rate or second fluid flow rate and outputs the heat transfer rate with the at least one of first fluid flow rate or the second fluid flow rate.

16. The monitoring system of claim 10, wherein the monitor unit automatically determines whether the first fluid flow rate is below a first low specified flow rate, and if so, automatically issues a warning that the first fluid flow rate is below the first low specified flow rate, automatically determines whether the first fluid flow rate is above a first high specified flow rate, and if so, automatically issues a warning that the first fluid flow rate is above the first high specified flow rate, automatically determines whether the second fluid flow rate is below a second low specified flow rate, and if so, automatically issues a warning that the second fluid flow rate is below the second low specified flow rate, or automatically determines whether the second fluid flow rate is above a second high specified flow rate, and if so, automatically issues a warning that the second fluid flow rate is above the second high specified flow rate.

17. A data center comprising:
a heat exchanger for facilitating cooling of at least one electronics rack within the data center; and
a monitoring system for the heat exchanger, the monitoring system comprising:
a database holding pre-characterized correlation data for the heat exchanger, the pre-characterized correlation data comprising data correlating effectiveness of the heat exchanger to flow rates of a first fluid through the heat exchanger and flow rates of a second fluid through the heat exchanger, wherein when operational, heat is transferred across the heat exchanger between the first fluid and the second fluid;
a first inlet temperature sensor for sensing inlet temperature of the first fluid passing through the heat exchanger, when operational, and a first outlet temperature sensor for sensing outlet temperature of the first fluid passing through the heat exchanger;
a second inlet temperature sensor for sensing inlet temperature of the second fluid passing through the heat exchanger, when operational, and a second outlet temperature sensor for sensing outlet temperature of the second fluid passing through the heat exchanger; and
a monitor unit coupled to the first and second inlet temperature sensors and the first and second outlet temperature sensors for obtaining the sensed inlet and outlet temperatures of the first fluid and the second fluid, and for employing the sensed inlet and outlet temperatures of the first fluid and the second fluid and the pre-characterized correlation data in automatically determining at least one of flow rate of the first fluid through the heat exchanger or flow rate of the second fluid through the heat exchanger, and outputting the determined flow rate of the first fluid or the flow rate of the second fluid through the heat exchanger.

18. The data center of claim 17, wherein the monitor unit employs the sensed inlet and outlet temperatures of the first fluid and the sensed inlet and outlet temperatures of the second fluid in obtaining effectiveness of the heat exchanger and a heat capacity rate ratio for the heat exchanger, and employs the effectiveness and the heat capacity rate ratio in comparison with the pre-characterized correlation data in determining flow rate of the first fluid and flow rate of the second fluid through the heat exchanger.

19. The data center of claim 18, wherein the monitor unit employs the sensed inlet and outlet temperatures of the first fluid and the sensed inlet and outlet temperatures of the second fluid in determining whether the first fluid or the second fluid has a lower heat capacity rate, and wherein the automatically determining employs a first set of pre-characterized correlation data if the first fluid has a lower heat capacity rate than the second fluid, or employs a second set of pre-characterized correlation data if the second fluid has a lower heat capacity rate than the first fluid.

20. The data center of claim 19, wherein the monitor unit:
identifies bounding values for at least one of the first fluid flow rate or the second fluid flow rate using the pre-characterized correlation data, and wherein the using comprises:
estimating the second fluid flow rate to be one flow rate of the second fluid in the pre-characterized correlation data;

estimating the first fluid flow rate using the effectiveness, and constants derived from the pre-characterized correlation data for the estimated second fluid flow rate;

determining an estimated heat capacity rate ratio for the heat exchanger employing the estimated first fluid flow rate and the estimated second fluid flow rate; and comparing the estimated heat capacity rate ratio for the heat exchanger to the determined heat capacity rate ratio for the heat exchanger, and if the estimated heat capacity rate ratio for the heat exchanger is less than the determined heat capacity rate ratio for the heat exchanger, repeats the using for a second fluid flow rate comprising a next flow rate of the second fluid in the pre-characterized correlation data, otherwise, identifies the currently estimated second fluid flow rate and the just prior estimated second fluid flow rate as bounding second fluid flow rates from the pre-characterized correlation data and employs the bounding second fluid flow rates in interpolating a fluid flow rate for the second fluid, and interpolates values for constants employed in relating the first fluid flow rate to heat exchanger effectiveness, and thereafter, determines the first fluid flow rate using the determined effectiveness and the interpolated constants.

* * * * *